US010153408B2

(12) United States Patent
Abe et al.

(10) Patent No.: US 10,153,408 B2
(45) Date of Patent: Dec. 11, 2018

(54) LIGHT-EMITTING APPARATUS AND ILLUMINATION APPARATUS

(71) Applicant: PANASONIC INTELLECTUAL PROPERTY MANAGEMENT CO., LTD., Osaka (JP)

(72) Inventors: Masumi Abe, Osaka (JP); Toshifumi Ogata, Osaka (JP); Toshiaki Kurachi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/692,527

(22) Filed: Aug. 31, 2017

(65) Prior Publication Data

US 2018/0069162 A1    Mar. 8, 2018

(30) Foreign Application Priority Data

Sep. 7, 2016   (JP) .................................. 2016-175033

(51) Int. Cl.
| | | |
|---|---|---|
| *H01L 33/50* | (2010.01) | |
| *H01L 25/16* | (2006.01) | |
| *H01L 25/075* | (2006.01) | |
| *H01L 27/15* | (2006.01) | |
| *H01L 33/56* | (2010.01) | |

(52) U.S. Cl.
CPC ........ *H01L 33/507* (2013.01); *H01L 25/0753* (2013.01); *H01L 27/156* (2013.01); *H01L 33/56* (2013.01); *H01L 2224/48091* (2013.01); *H01L 2224/48137* (2013.01)

(58) Field of Classification Search
CPC ........ H01L 33/50–33/508; H01L 2224/48137; H01L 25/167; H01L 25/0753; H01L 27/156
See application file for complete search history.

(56) References Cited

U.S. PATENT DOCUMENTS

| | | |
|---|---|---|
| 2011/0278605 A1 | 11/2011 | Agatani et al. |
| 2014/0098529 A1 | 4/2014 | Hata et al. |
| 2014/0197431 A1 | 7/2014 | Oka |
| 2016/0081142 A1 | 3/2016 | Abe et al. |

FOREIGN PATENT DOCUMENTS

| | | |
|---|---|---|
| JP | 2012-004519 | 1/2012 |
| JP | 2013-051375 | 3/2013 |
| JP | 2014-049504 | 3/2014 |
| JP | 2015-122541 | 7/2015 |
| JP | 2016-058614 | 4/2016 |
| WO | 2013/015058 | 1/2013 |

*Primary Examiner* — Suezu Ellis
(74) *Attorney, Agent, or Firm* — Greenblum & Bernstein, P.L.C.

(57) ABSTRACT

A light-emitting apparatus includes a first relay line and a second relay line. The first and second relay lines are disposed between a first region and a second region of a substrate. Further, the first and second relay lines extend at least partially parallel to each other in a second direction that crosses a first direction in which the first region and the second region are aligned. The first relay line electrically connects a first light-emitting element group disposed in the first region and a third light-emitting element group disposed in the second region. The second relay line electrically connects a second light-emitting element group disposed in the first region and a fourth light-emitting element group disposed in the second region.

20 Claims, 18 Drawing Sheets

LIGHT-EMITTING APPARATUS AND ILLUMINATION APPARATUS

CROSS REFERENCE TO RELATED APPLICATION

This application claims the benefit of priority of Japanese Patent Application Number 2016-175033 filed on Sep. 7, 2016, the entire content of which is hereby incorporated by reference.

BACKGROUND

1. Technical Field

The present disclosure relates to a light-emitting apparatus and an illumination apparatus in which the light-emitting apparatus is used.

2. Description of the Related Art

A conventional chip on board (COB) light-emitting apparatus (light-emitting module) is known in which a light-emitting diode (LED) chip mounted on a substrate is sealed with a sealant formed using a resin that contains phosphors. Japanese Unexamined Patent Application Publication No. 2012-4519 discloses a light-emitting apparatus whose chromaticity can be readily adjusted.

SUMMARY

In the case of the above light-emitting apparatus, if a plurality of light-emitting element groups that are collectively caused to emit light when a voltage is applied to an anode terminal and a cathode terminal are disposed in separate regions, it may be difficult to electrically connect such a plurality of light-emitting element groups.

The present disclosure provides a light-emitting apparatus and an illumination apparatus which readily electrically connect a plurality of light-emitting element groups.

A light-emitting apparatus according to an aspect of the present disclosure includes: a substrate; a first light-emitting element group and a second light-emitting element group which are disposed in a first region on the substrate; a third light-emitting element group and a fourth light-emitting element group which are disposed in a second region on the substrate; a first terminal, a second terminal, a third terminal, and a fourth terminal which are disposed on the substrate; and a first relay line and a second relay line which are disposed in a region between the first region and the second region on the substrate, and at least partially extend parallel to each other in a direction crossing a direction in which the first region and the second region are aligned, wherein the first light-emitting element group is electrically connected with the first terminal and the first relay line, the second light-emitting element group is electrically connected with the second terminal and the second relay line, the third light-emitting element group is electrically connected with the third terminal and the first relay line, and the fourth light-emitting element group is electrically connected with the fourth terminal and the second relay line.

An illumination apparatus according to an aspect of the present disclosure includes: the light-emitting apparatus; and a lighting apparatus which supplies the light-emitting apparatus with power for the light-emitting apparatus to emit light.

According to the present disclosure, a light-emitting apparatus and an illumination apparatus which readily electrically connect a plurality of light-emitting element groups are achieved.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Figure 1:
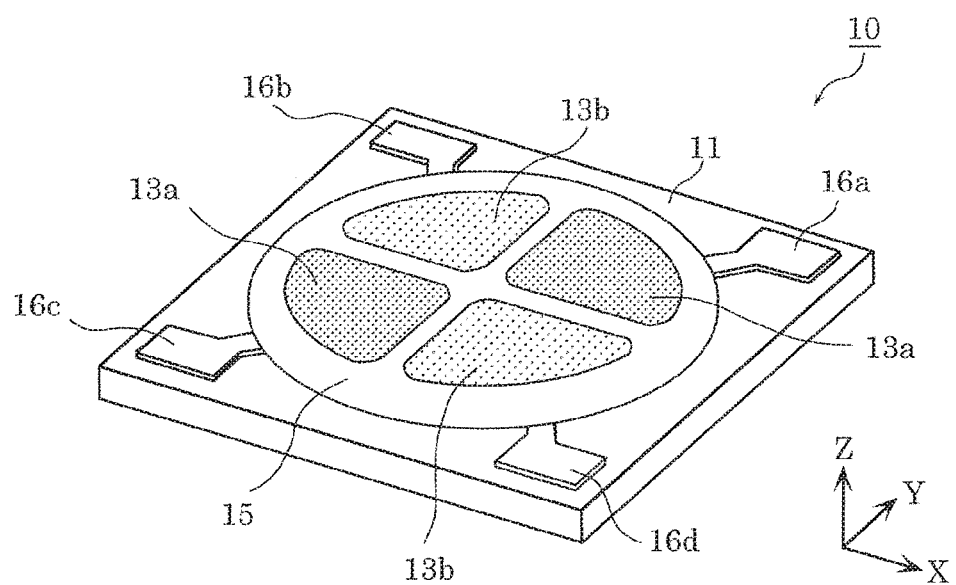
FIG. 1 is an external perspective view of a light-emitting apparatus according to Embodiment 1.

The following describes embodiments with reference to the drawings. Note that the embodiments described below each show a general or specific example. The numerical values, shapes, materials, elements, and the arrangement and, connection of the elements, for instance, described in the following embodiments are examples, and thus are not intended to limit the present disclosure. Therefore, among the elements in the following embodiments, elements not recited in any of the independent claims defining the most generic part of the present disclosure are described as arbitrary elements.

Note that the diagrams are schematic diagrams, and do not necessarily provide strict illustration. In the drawings, the same numeral is given to a substantially same configuration, and a redundant description thereof may be omitted or simplified.

In addition, the drawings used to give explanation in the following embodiments may show a coordinate axis. The Z-axis direction of the coordinate axis is, for example, the perpendicular direction, the positive side of the Z axis is expressed as the upper side (upper part), and the negative side of the Z axis is expressed as the lower side (lower part). In other words, the Z-axis direction is a direction perpendicular to a substrate included in a light-emitting apparatus. The X-axis direction and the Y-axis direction are orthogonal to each other on a plane perpendicular to the Z axis (level surface). The X-Y plane is a plane parallel to a principal surface of the substrate included in the light-emitting apparatus. For example, in the following embodiments, a "plan view" means a view in the Z-axis direction.

Embodiment 1

[Configuration of Light-Emitting Apparatus]

Figure 2:
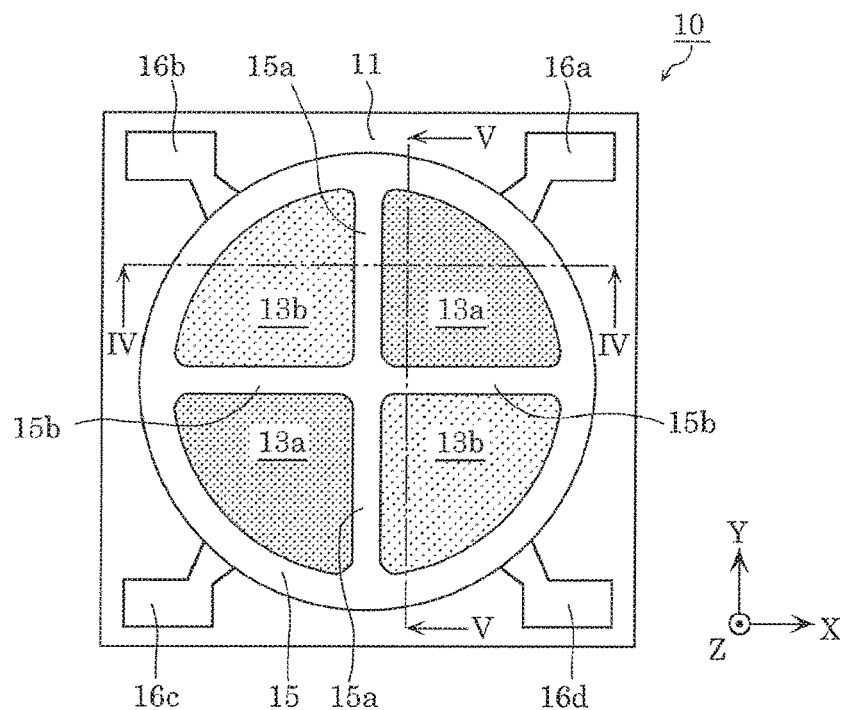
FIG. 2 is a plan view of the light-emitting apparatus according to Embodiment 1.
Figure 3:
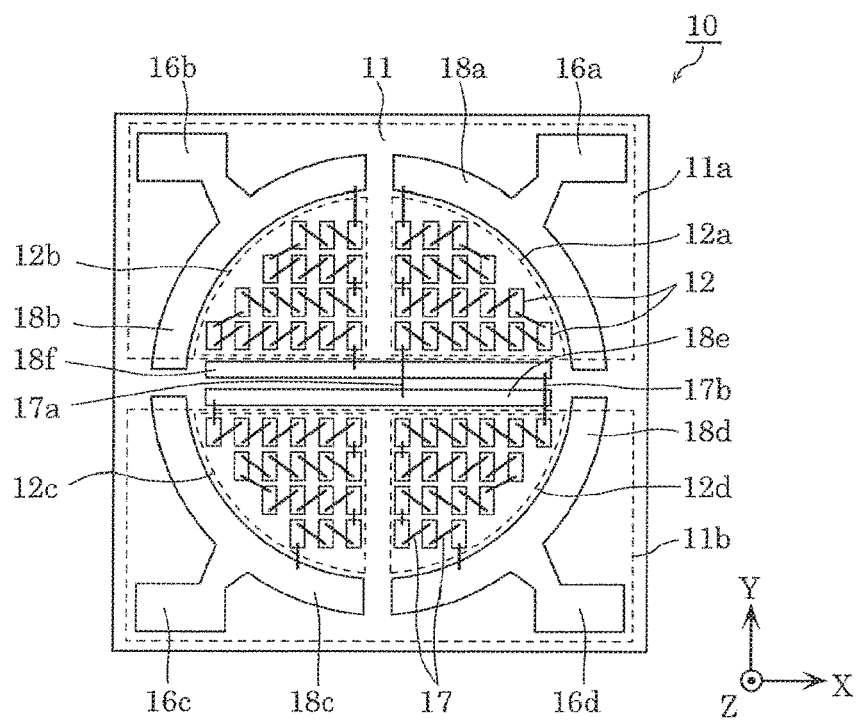
FIG. 3 is a plan view illustrating an internal structure of the light-emitting apparatus according to Embodiment 1.
Figure 4:
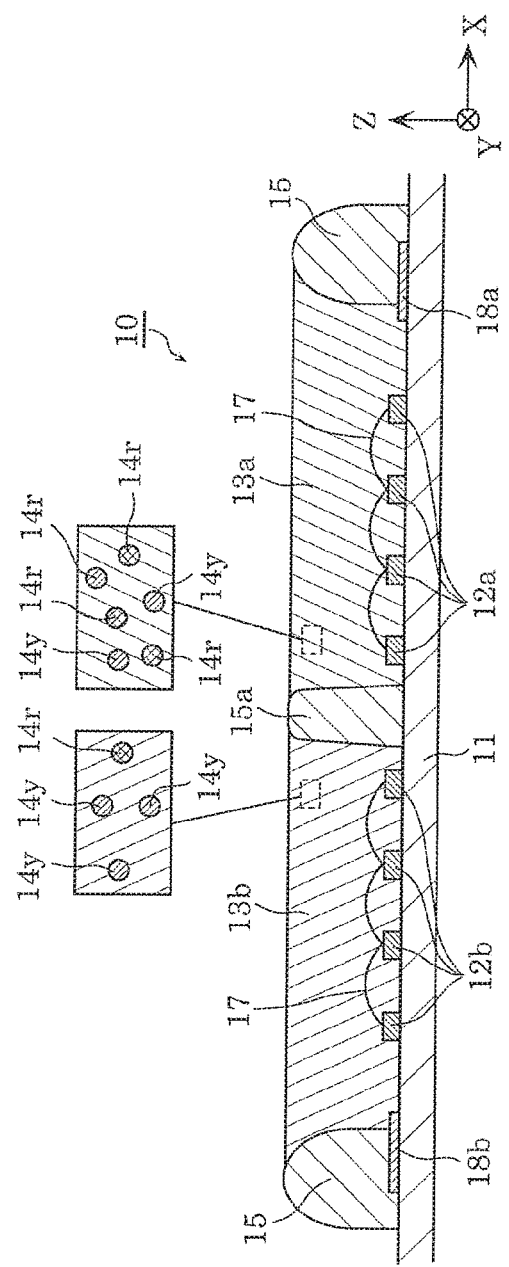
FIG. 4 is a schematic cross-sectional view taken along hue in FIG. 2.
Figure 5:
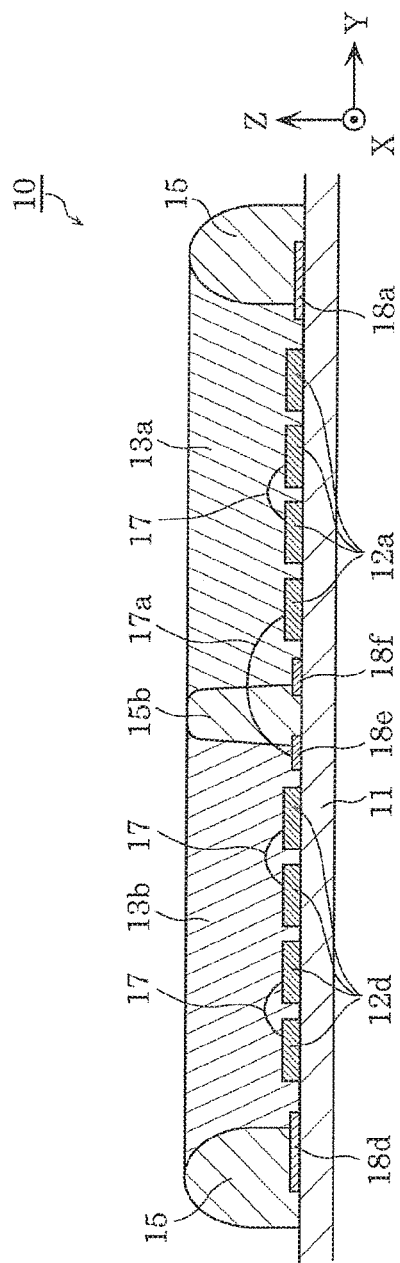
FIG. 5 is a schematic cross-sectional view taken along line V-V in F 2.

The first describes a configuration of a light-emitting apparatus according to Embodiment 1 with reference to the drawings. FIG. 1 is an external perspective view of the light-emitting apparatus according to Embodiment 1. FIG. 2 is a plan view of the light-emitting apparatus according to Embodiment 1. FIG. 3 is a plan view illustrating an internal structure of the light-emitting apparatus according to Embodiment 1. FIG. 4 is a schematic cross-sectional view taken along line IV-IV in FIG. 2. FIG. 5 is a schematic cross-sectional view taken along line V-V in FIG. 2. Note that FIG. 3 mentioned above is a plan view equivalent to FIG. 2 from which first sealants 13a, second sealants 13b, annular wall 15, first partitions 15a; and second partitions 15b are removed, and illustrating an internal structure such as the arrangement of LED chips 12 and a wiring pattern.

As illustrated in FIGS. 1 to 5, light-emitting apparatus 10 according to Embodiment 1 includes: substrate 11; a plurality of LED chips 12; first terminal 16a; second terminal 16b; third terminal 16c; fourth terminal 16d; first relay line 18e; and second relay line 18f. LED chips 12 are divided into first light-emitting element group 12a, second light-emitting element group 12b, third light-emitting element group 12c, and fourth light-emitting element group 12d. Light-emitting apparatus 10 includes first sealants 13a, second sealants 13b, annular wall 15, first partitions 15a, second partitions 15b, first line 18a, second line 18b, third line 18c, and fourth line 18d.

Light-emitting apparatus 10 is an LED module having a so-called chip on board (COB) structure in which LED chips 12 are directly mounted on substrate 11, and emits white light. Light-emitting apparatus 10 is a color-adjustable apparatus. The color temperature of white light emitted by light-emitting apparatus 10 is changed by controlling DC power supplied between first terminal 16a and third terminal 16c and DC power supplied between second terminal 16b and fourth terminal 16d.

[Substrate]

The first describes a configuration of substrate 11. LED chips 12 are disposed on substrate 11. Substrate 11 is a metal base substrate or a ceramic substrate, for example. Substrate 11 may be a resin substrate whose base material is resin.

As the ceramic substrate, an alumina substrate made of aluminum oxide (alumina) or an aluminum nitride substrate made of aluminum nitride, for instance, is employed. As the metal base substrate, an aluminum alloy substrate, an iron alloy substrate, or a copper alloy substrate which has a surface on which an insulating film is formed is employed, for example. As the resin substrate, a glass epoxy substrate made of glass fiber and an epoxy resin is employed, for example.

Note that for example, a substrate having a high light reflectance (a light reflectance of 90% or higher, for example) may be employed as substrate 11. By employing a substrate having a high light reflectance as substrate 11, light emitted by LED chips 12 can be reflected off the surface of substrate 11. As a result, the light extraction efficiency of light-emitting apparatus 10 improves. An example of such a substrate is a white ceramic substrate whose base material is alumina.

A light-transmitting substrate having a high light transmittance may be employed as substrate 11. Examples of such a substrate include a light-transmitting ceramic substrate made of polycrystalline alumina or aluminum nitride, a transparent glass substrate made of glass, a crystal substrate made of crystal, a sapphire substrate made of sapphire, and a transparent resin substrate made of a transparent resin material.

Note that substrate 11 has a square (quadrilateral) shape in a plan view, but may have other shapes such as a round shape.

The principal surface of substrate 11 includes first region 11a and second region 11b, as illustrated in FIG. 3. When the principal surface of substrate 11 is halved into two regions along an imaginary line along the X axis, first region 11a is included in a region on the positive side of the Y axis among the two regions. Similarly, second region 11b is included in a region on the negative side of the Y axis among the two regions. Note that the positions of such first region 11a and second region 11b are examples. First region 11a and second region 11b may be located in arbitrary positions on substrate 11.

Note that in the following embodiments, the direction in which first region 11a and second region 11b are aligned is stated as a first direction, and the direction perpendicularly crossing the first direction is stated as a second direction. The first direction is specifically the Y-axis direction, and the second direction is specifically the X-axis direction. Note that in the embodiments, the second direction is a direction perpendicularly crossing the first direction, but it is sufficient if the second direction crosses the first direction.

[Terminals and Lines]

The following describes terminals and lines disposed on substrate 11. As power supply terminals for supplying power to light-emitting apparatus 10 from the outside of light-emitting apparatus 10, first terminal 16a, second terminal 16b, third terminal 16c, and fourth terminal 16d are disposed on substrate 11. First terminal 16a and second terminal 16b are disposed in first region 11a on substrate 11, and third terminal 16c and fourth terminal 16d are disposed in second region 11b on substrate 11. More specifically, first terminal 16a, second terminal 16b, third terminal 16c, and fourth terminal 16d are disposed, one at each of the corners of substrate 11. First terminal 16a, second terminal 16b, third terminal 16c, and fourth terminal 16d are substantially quadrilateral in a plan view. Note that the positions on substrate 11 at which first terminal 16a, second terminal 16b, third terminal 16c, and fourth terminal 16d are disposed are not limited in particular.

First terminal 16a and third terminal 16c form a pair of terminals for supplying power to first light-emitting element group 12a and third light-emitting element group 12c. For example, DC power is supplied between first terminal 16a and third terminal 16c. Specifically, one of first terminal 16a and third terminal 16c is an anode terminal, and the other is a cathode terminal. Note that first light-emitting element group 12a and third light-emitting element group 12c are connected in series via first relay line 18e, as later described.

Second terminal 16b and fourth terminal 16d form a pair of terminals for supplying power to second light-emitting element group 12b and fourth light-emitting element group 12d. For example, DC power is supplied between second terminal 16a and fourth terminal 16d. Specifically, one of second terminal 16b and fourth terminal 16d is an anode terminal, and the other is a cathode terminal. Note that second light-emitting element group 12b and fourth light-emitting element group 12d are connected in series via second relay line 18f, as later described.

Note that the number of LED chips 12 included in first light-emitting element group 12a, the number of LED chips 12 included in second light-emitting element group 12b, the number of LED chips 12 included in third light-emitting element group 12c, and the number of LED chips 12 included in fourth light-emitting element group 12d are the same. Specifically, the number of LED chips 12 connected in series between first terminal 16a and third terminal 16c, and the number of LED chips 12 connected in series between second terminal 16b and fourth terminal 16d are the same.

Thus, a voltage applied between first terminal 16a and third terminal 16c and a voltage applied between second terminal 16b and fourth terminal 16d may be the same. At this time, a voltage having the same value may be applied to first terminal 16a and second terminal 16b, and a voltage having the same value may be applied to third terminal 16c and fourth terminal 16d. Accordingly, a lighting apparatus (lighting circuit) which applies a voltage between second terminal 16b and fourth terminal 16d may be of the same type as a lighting apparatus which applies a voltage between first terminal 16a and third terminal 16c. This allows the two lighting apparatuses to have a common configuration.

For example, first line 18a, second line 18b, third line 18c, fourth line 18d, first relay line 18e, and second relay line 18f are disposed on substrate 11, as lines for electrically connecting LED chips 12.

First line 18a electrically connects first light-emitting element group 12a and first terminal 16a. Specifically, first line 18a is integrally patterned with first terminal 16a, and electrically connected with first light-emitting element group 12a by bonding wire 17. Bonding wire 17 is an example of a metal line (wire).

Second line 18b electrically connects second light-emitting element group 12b and second terminal 16b. Specifically, second line 18b is integrally patterned with second terminal 16b, and electrically connected with second light-emitting element group 12b by bonding wire 17.

Third line 18c electrically connects third light-emitting element group 12c and third terminal 16c. Specifically, third line 18c is integrally patterned with third terminal 16c, and electrically connected with third light-emitting element group 12c by bonding wire 17.

Fourth line 18d electrically connects fourth light-emitting element group 12d and fourth terminal 16d. Specifically, fourth line 18d is integrally patterned with fourth terminal 16d, and electrically connected with fourth light-emitting element group 12d by bonding wire 17.

In a plan view, first line 18a, second line 18b, third line 18c, and fourth line 18d are arcs of a circle whose center is at the center (optic axis) of light emission by light-emitting apparatus 10.

The above described terminals, lines, and bonding wires 17 (including bonding wires 17a and 17b) are formed using a metal material such as gold (Au), silver (Ag), or copper (Cu).

[Relay Lines]

The following describes first relay line 18e and second relay line 18f. First light-emitting element group 12a and third light-emitting element group 12c need to be electrically connected in order to collectively cause first light-emitting element group 12a disposed in first region 11a and third light-emitting element group 12c disposed in second region 11b to emit light by supplying DC power between first terminal 16a and third terminal 16c.

Thus, first relay line 18e electrically connects first light-emitting element group 12a and third light-emitting element group 12c. Specifically, first relay line 18e connects first light-emitting element group 12a and third light-emitting element group 12c in series. First relay line 18e is electrically connected with first light-emitting element group 12a by bonding wire 17a, and is electrically connected with third light-emitting element group 12c by bonding wire 17. Note that bonding wire 17a is an example of a first metal line, and electrically connects first relay line 18e and first light-emitting element group 12a across second relay line 18f, as illustrated in FIG. 5.

Second light-emitting element group 12b and fourth light-emitting element group 12d need to be electrically connected in order to collectively cause second light-emitting element group 12b disposed in first region 11a and fourth light-emitting element group 12d disposed in second region 11b to emit light by supplying DC power between second terminal 16b and fourth terminal 16d.

Thus, second relay line 18f electrically connects second light-emitting element group 12b and fourth light-emitting element group 12d. Specifically, second relay line 18f connects second light-emitting element group 12b and fourth light-emitting element group 12d in series. Second relay line 18f is electrically connected with second light-emitting element group 12b by bonding wire 17, and is electrically connected with fourth light-emitting element group 12d by bonding wire 17b. Note that bonding wire 17b is an example of a second metal line, and electrically connects second relay line 18f and fourth light-emitting element group 12d across first relay line 18e, similarly to bonding wire 17a.

First relay line 18e and second relay line 18f linearly extend in the second direction (the X-axis direction), and are disposed side by side (in parallel) in the first direction (the Y-axis direction) in a region between first region 11a and second region 11b on substrate 11. In other words, first relay line 18e and second relay line 18f are disposed in a region between first region 11a and second region 11b, and extend parallel to each other in the second direction. First relay line 18e and second relay line 18f may entirely extend parallel to each other or may at least partially extend parallel to each other. First relay line 18e is closer to second region 11b than second relay line 18f is.

Note that the shapes of first relay line 18e and second relay line 18f are not limited to the linear shape, and may be a partially curved shape. First relay line 18e and second relay line 18f are elongated in the second direction (which is the longitudinal direction), for example.

First relay line 18e and second relay line 18f described above are formed using a metal material, such as gold (Au), silver (Ag), or copper (Cu), for example.

The following describes advantageous effects achieved by first relay line 18e and second relay line 18f.

If light-emitting apparatus 10 does not include first relay line 18e and second relay line 18f, first light-emitting element group 12a and third light-emitting element group 12c are to be electrically connected by bonding wire 17, for example, and second light-emitting element group 12b and fourth light-emitting element group 12d are to be electrically connected by bonding wire 17, for example. Consequently, bonding wire 17 which electrically connects first light-emitting element group 12a and third light-emitting element group 12c and bonding wire 17 which electrically connects second light-emitting element group 12b and fourth light-emitting element group 12d three-dimensionally cross near the center of substrate 11. This makes the structure of connecting the plurality of light-emitting element groups complicated.

In contrast, first relay line 18e and second relay line 18f prevent, for instance, three-dimensional crossing of bonding wires 17, and thus simplify the structure of connecting the plurality of light-emitting element groups. Therefore, light-emitting apparatus 10 in which a plurality of light-emitting element groups are electrically connected with ease can be achieved.

In addition, there is a case where first light-emitting element group 12a and third light-emitting element group 12c are not disposed side by side in the first direction, and second light-emitting element group 12b and fourth light-emitting element group 12d are not disposed side by side in the first direction, similarly to light-emitting apparatus 10. In other words, there is a case where a direction which first light-emitting element group 12a and third light-emitting element group 12c are aligned, and a direction in which second light-emitting element group 12b and fourth light-emitting element group 12d are aligned cross each other. In such a case, particularly, first relay line 18e and second relay line 18f extending parallel to each other in the second direction decrease the distances from first relay line 18e and second relay line 18f to the light-emitting element groups, thus shortening the lengths of bonding wires 17. This simplifies the structure of connecting the plurality of light-emitting element groups.

[Light-Emitting Element Groups]

The following describes first light-emitting element group 12a, second light-emitting element group 12b, third light-emitting element group 12c, and fourth light-emitting element group 12d. First light-emitting element group 12a, second light-emitting element group 12b, third light-emitting element group 12c, and fourth light-emitting element group 12d are each formed by connecting LED chips 12 in series with bonding wires 17 using chip-to-chip bonding. Note that first light-emitting element group 12a, second light-emitting element group 12b, third light-emitting element group 12c, and fourth light-emitting element group 12d may each include at least one LED chip 12.

LED chips 12 are examples of a light-emitting element, and disposed (mounted) on substrate 11. LED chips 12 are, for example, blue LED chips formed using InGaN material and having a center wavelength (peak wavelength of an emission spectrum) of at least 430 nm and at most 480 nm. LED chips 12 thus emit blue light. LED chips 12 on substrate 11 each emit light mainly upward (in the positive Z-axis direction).

First light-emitting element group 12a is disposed in first region 11a on substrate 11. In a plan view, entire first light-emitting element group 12a is disposed in a substantially sector-shaped region included in a first quadrant on substrate 11.

A terminal (one of the cathode terminal and the anode terminal) of first light-emitting element group 12a is electrically connected with first line 18a by bonding wire 17. The other terminal (the other of the cathode terminal and the anode terminal) of first light-emitting element group 12a is electrically connected with first relay line 18e by bonding wire 17a extending across second relay line 18f.

Second light-emitting element group 12b is disposed in first region 11a on substrate 11. In a plan view, entire second light-emitting element group 12b is disposed in a substantially sector-shaped region included in a second quadrant on substrate 11.

A terminal of second light-emitting element group 12b is electrically connected with second line 18b by bonding wire 17. The other terminal of second light-emitting element group 12b is electrically connected with second relay line 18f by bonding wire 17.

Third light-emitting element group 12c is disposed in second region 11b on substrate 11. In a plan view, entire third light-emitting element group 12c is disposed in substantially sector-shaped region included in a third quadrant on substrate 11.

A terminal of third light-emitting element group 12c is electrically connected with third line 18c by bonding wire 17. The other terminal of third tight-emitting element group 12c is electrically connected with first relay line 18e by bonding wire 17.

Fourth light-emitting element group 12d is disposed in second region 11b on substrate 11. In a plan view, entire fourth light-emitting element group 12d is disposed in a substantially sector-shaped region included in a fourth quadrant on substrate 11.

A terminal of fourth light-emitting element group 12d is electrically connected with fourth line 18d by bonding wire 17. The other terminal of fourth light-emitting element group 12d is electrically connected with second relay line 18f by bonding wire 17b extending across first relay line 18e.

The following is a summary of the arrangement of first light-emitting element group 12a, second light-emitting element group 12b, third light-emitting element group 12c, and fourth light-emitting element group 12d.

In first region 11a, first light-emitting element group 12a and second light-emitting element group 12b are disposed side by side in the second direction. Similarly, in second region 11b, third light-emitting element group 12c and fourth light-emitting element group 12d are disposed side by side in the second direction.

First light-emitting element group 12a and fourth light-emitting element group 12d are disposed side by side in the first direction, and second light-emitting element group 12b and third light-emitting element group 12c are disposed side by side in the first direction.

First light-emitting element group 12a and third light-emitting element group 12c are located diagonally, but not disposed side by side in the first direction. Second light-emitting element group 12b and fourth light-emitting element group 12d are located diagonally, but not disposed side by side in the first direction. The direction in which first light-emitting element group 12a and third light-emitting element group 12c are aligned and the direction in which second light-emitting element group 12b and fourth light-emitting element group 12d are aligned cross.

[Sealant]

The following describes first sealants 13a and second sealants 13b. The first describes first sealants 13a. As illustrated in FIG. 4, first sealant 13a seals first light-emitting element group 12a, bonding wires 17 used to electrically connect first light-emitting element group 12a, and a portion of first line 18a. First sealant 13a seals third light-emitting element group 12c, bonding wires 17 used to electrically connect third light-emitting element group 12c, and at least a portion of third line 18c. First sealants 13a are above first light-emitting element group 12a and third light-emitting element group 12c.

First sealants 13a have a function of protecting first light-emitting element group 12a, third light-emitting element group 12c, bonding wires 17, a portion of first line 18a, and a portion of third line 18c from dust, moisture, external force, and others.

First sealants 13a are made of a light-transmitting resin material (base material) which includes phosphors. An example of the base material of first sealants 13a is methyl silicone resin, but an epoxy resin or a urea resin may be employed.

First sealants 13a include, for example, yellow phosphors 14y and red phosphors 14r. Specifically, an example of yellow phosphor 14y is an yttrium aluminum garnet (YAG) phosphor having an emission peak wavelength of at least 550 nm and at most 570 nm. Specifically, examples of red phosphor 14r include $CaAlSiN_3:Eu^{2+}$ phosphor and $(Sr, Ca)AlSiN_3:Eu^{2+}$ phosphor having an emission peak wavelength of at least 610 nm and at most 620 nm.

Phosphors included in first sealants 13a are not limited in particular. First sealants 13a may include phosphors that emit light by being excited by light emitted by LED chips 12. Filler may be included in first sealants 13a. The filler is silica having a particle diameter of about 10 nm, for example. Inclusion of the filler prevents phosphors from settling since the filler provides resistance. This allows phosphors to be uniformly distributed in first sealants 13a.

White light is emitted through both first sealant 13a located above first light-emitting element group 12a and first sealant 13a located above third light-emitting element group 12c. If LED chips 12 included in first light-emitting element group 12a and third light-emitting element group 12c emit blue light, yellow phosphors 14y included in first sealants 13a convert the wavelength a portion of the emitted blue light so that yellow light is obtained. Red phosphors 14r included in first sealants 13a convert the wavelength of a portion of the emitted blue light so that red light is obtained. Blue light not absorbed by yellow phosphors 14y and red phosphors 14r, yellow light as a result of wavelength conversion by yellow phosphors 14y, and red light as a result of wavelength conversion by red phosphors 14r are diffused and mixed in first sealants 13a. Accordingly, white light is emitted through first sealants 13a.

The color temperature of the white light emitted through first sealant 13a located above first light-emitting element group 12a is the same as the color temperature of the white light emitted through first sealant 13a located above third light-emitting element group 12c. The color temperature of the white light is set to, for example, 2700 K by adjusting the amounts of yellow phosphors 14y and red phosphors 14r included in first sealants 13a (contents of yellow phosphors 14y and red phosphors 14r in first sealants 13a).

The following describes second sealants 13b. Second sealant 13b seals second light-emitting element group 12b, bonding wires 17 used to electrically connect second light-emitting element group 12b, and a portion of second line 18b. Second sealant 13b seals fourth light-emitting element group 12d, bonding wires 17 used to electrically connect fourth light-emitting element group 12d, and at least a portion of fourth line 18d. Second sealants 13b are above second light-emitting element group 12b and fourth light-emitting element group 12d.

Second sealants 13b have a function of protecting second light-emitting element group 12b, fourth light-emitting element group 12d, bonding wires 17, a portion of second line 18b, and a portion of fourth line 18d from dust, moisture, external force, and others.

Second sealants 13b are made of a light-transmitting resin material (base material) which includes phosphors. An example of the base material of second sealants 13b is methyl silicone resin, but an epoxy resin or a urea resin may be employed.

Second sealants 13b include yellow phosphors 14y and red phosphors 14r, for example. The phosphors included in second sealants 13b are not limited in particular. Second sealants 13b may include phosphors which emit light by being excited by light emitted by LED chips 12. Second sealants 13b may include filler.

White light is emitted through both second sealant 13b located above second light-emitting element group 12b and second sealant 13b located above fourth light-emitting element group 12d. If LED chips 12 included in second light-emitting element group 12b and fourth light-emitting element group 12d emit blue light, yellow phosphors 14y included in second sealants 13b convert a wavelength of a portion of the emitted blue light so that yellow light is obtained. Red phosphors 14r included in second sealants 13b convert the wavelength of a portion of the emitted blue light so that red light is obtained. Blue light not absorbed by yellow phosphors 14y and red phosphors 14r, yellow light as a result of wavelength conversion by yellow phosphors 14y, and red light as a result of wavelength conversion by red phosphors 14r are diffused and mixed in second sealants 13b. Accordingly, white light is emitted through second sealants 13b.

The color temperature of the white light emitted through second sealant 13b located above second light-emitting element group 12b is the same as the color temperature of the white light emitted through second sealant 13b located above fourth light-emitting element group 12d. The color temperature of the white light is set to, for example about 8000 K by adjusting the amounts of yellow phosphors 14y and red phosphors 14r included in second sealants 13b (contents of yellow phosphors 14y and red phosphors 14r in second sealants 13b).

Accordingly, in Embodiment 1, the phosphor content of first sealants 13a differs from the phosphor content of second sealants 13b. Specifically, first sealants 13a have a higher content of red phosphors 14r than second sealants 13b. As a result, the color of light emitted through first sealants due to light emission by first light-emitting element group 12a and third light-emitting element group 12c is different from the color of light emitted through second sealants 13b due to light emission by second light-emitting element group 12b and fourth light-emitting element group 12d.

Note that "the color of light is different" herein means that the colors of light are intentionally different, and thus does not mean that the colors of light are slightly different due to, for instance, variations between products. "The colors of light are intentionally different" means that the color temperature of emitted light is different by 1000 K or more, for example.

As described above, first light-emitting element group 12a and third light-emitting element group 12c emit light when DC power is supplied (a DC voltage is applied) between first terminal 16a and third terminal 16c. On the other hand, second light-emitting element group 12b and fourth light-emitting element group 12d emit light when DC power is supplied (a DC voltage is applied) between second terminal 16b and fourth terminal 16d. Thus, light emission by first light-emitting element group 12a and third light-emitting element group 12c, and light emission by second light-emitting element group 12b and fourth light-emitting element group 12d can be independently controlled.

If only first light-emitting element group 12a and third light-emitting element group 12c are selectively caused to emit light, light-emitting apparatus 10 emits white light having 2700 K, and if only second light-emitting element group 12b and fourth light-emitting element group 12d are selectively caused to emit light, light-emitting apparatus 10 emits white light having 8000 K. If first light-emitting element group 12a and third light-emitting element group 12c, and second light-emitting element group 12b and fourth light-emitting element group 12d are caused to emit light, light-emitting apparatus 10 can emit white light having at least 2700 K and at most 8000 K, depending on the light output by first light-emitting element group 12a and third light-emitting element group 12c and the light output by second light-emitting element group 12b and fourth light-emitting element group 12d.

Accordingly, light-emitting apparatus 10 is a color adjustable apparatus which emits white light having 2700 K when a voltage is applied between first terminal 16a and third terminal 16c, and emits white light having 8000 K when a voltage is applied between second terminal 16b and fourth terminal 16d. The white light having 2700 K is an example of light having a first color, and the white light having 8000 K is an example of light having a second color.

[Annular Wall and Partitions]

The following describes annular wall 15, first partitions 15a, and second partitions 15b. The first describes annular wall 15.

Annular wall 15 externally surrounds first light-emitting element group 12a, second light-emitting element group 12b, third light-emitting element group 12c, and fourth light-emitting element group 12d. Annular wall 15 is disposed over substrate 11 and lines on substrate 11 (first line 18a, second line 18b, third line 18c, and fourth line 18d). Each of first line 18a, second line 18b, third line 18c, and fourth line 18d is at least partially disposed under annular wall 15 on substrate 11. The plan view shape of annular wall 15 is a circle whose center is at the center (optic axis) of light emission by light-emitting apparatus 10. Note that the shape of annular wall 15 is not limited in particular. For example, annular wall 15 may be formed into a quadrilateral annular shape.

Annular wall 15 also functions as a dam material far blocking first sealants 13a and second sealants 13b. Specifically, first sealants 13a and second sealants 13b are in a region surrounded by annular wall 15. For example, an insulating thermosetting resin or an insulating thermoplastic resin is used for annular wall 15. More specifically, silicone resin, phenol resin, epoxy resin, bismaleimide-triazine resin, or poly phthalamide (PPA) resin, for instance, is used for annular wall 15.

Annular wall 15 may have light reflection properties in order to increase light extraction efficiency of light-emitting apparatus 10. Thus, white resin is used for annular wall 15. Note that $TiO_2$ particles, $Al_2O_3$ particles, $ZrO_2$ particles, or MgO particles, for instance, may be included in annular wall 15, in order to increase the light reflection properties of annular wall 15.

Note that although first sealant 13a and second sealant 13b may be in contact, first partition 15a or second partition 15b is disposed between first sealant 13a and second sealant 13b.

First partitions 15a extend in the first direction in a plan view. First partition 15a is disposed between (i) first light-emitting element group 12a and first sealant 13a sealing first light-emitting element group 12a and (ii) second light-emitting element group 12b and second sealant 13b sealing second light-emitting element group 12b. First partition 15a is also disposed between (i) third light-emitting element group 12c and first sealant 13a sealing third light-emitting element group 12c and (ii) fourth light-emitting element group 12d and second sealant 13b sealing fourth light-emitting element group 12d. Note that first partitions 15a are located between first light-emitting element group 12a and second light-emitting element group 12b and between third light-emitting element group 12c and fourth light-emitting element group 12d, also in a plan view.

Second partitions 15b extend in the second direction in a plan view. Second partition 15b is disposed between (i) first light-emitting element group 12a and first sealant 13a sealing first light-emitting element group 12a and (ii) fourth light-emitting element group 12d and second sealant 13b sealing fourth light-emitting element group 12d. Second partition 15b is also disposed between (i) second light-emitting element group 12b and second sealant 13b sealing second light-emitting element group 12b and (ii) third light-emitting element group 12c and first sealant 13a sealing third light-emitting element group 12c. Note that second partitions 15b are located between first light-emitting element group 12a and fourth light-emitting element group 12d and between second light-emitting element group 12b and third light-emitting element group 12c, also in a plan view.

In a plan view, second partitions 15b overlap a region between first relay line 18e and second relay line 18f (a region elongated in the X-axis direction). In other words, two second partitions 15b overlap at least a region between first relay line 18e and second relay line 18f.

In a plan view, two first partitions 15a and two second partitions 15b form a cross that equally divides a circular region surrounded by annular wall 15 into four. The four regions divided by two first partitions 15a and two second partitions 15b are each a round-cornered sector, and each of the four regions is filled with one of first sealants 13a and second sealants 13b.

For example, an insulating thermosetting resin or an insulating thermoplastic resin is used for first partitions 15a and second partitions 15b. More specifically, silicone resin, phenol resin, epoxy resin, bismaleimide-trazine resin, or poly phthalamide (PPA) resin, for instance, is used for first partitions 15a and second partitions 15b. First partitions 15a and second partitions 15b may be formed using the same material as that of annular wall 15.

First partitions 15a and second partitions 15b may have light reflection properties in order to increase light extraction efficiency of light-emitting apparatus 10. Thus, white resin is used for first partitions 15a and second partitions 15b. Note that $TiO_2$ particles, $Al_2O_3$ particles, $ZrO_2$ particles, and MgO particles, for instance, may be included in first partitions 15a and second partitions 15b, in order to increase light reflection properties of first partitions 15a and second partitions 15b.

First partitions 15a and second partitions 15b prevent portion of light emitted through one of first sealant 13a and second sealant 13b from entering the other of first sealant 13a and second sealant 13b so as not to re-excite phosphors in the other sealant. Preventing re-excitation avoids fall of the light extraction efficiency.

[Variation 1: Variation of Stack Structure]

In light-emitting apparatus 10, LED chips 12 are sealed by two types of resin materials (far example, first sealants 13a and second sealants 13b) having different phosphor contents. In light-emitting apparatus 10, other resin materials such as first partitions 15a and second partitions 15b are disposed between the two types of phosphor-containing resin materials.

Here, if bonding wires 17 and a wiring pattern on substrate 11, for instance, are disposed over two or more types of resin materials, bonding wires 17 or the wiring pattern may be damaged or deformed in a reliability test under severe conditions such as heat cycling, due to a difference in coefficients of linear expansion of the two or more types of resin materials. If the arrangement of bonding wires 17 and the wiring pattern is limited to prevent such a fall of reliability, the flexibility of arrangement (layout) of components disposed on substrate 11 falls.

Figure 6:
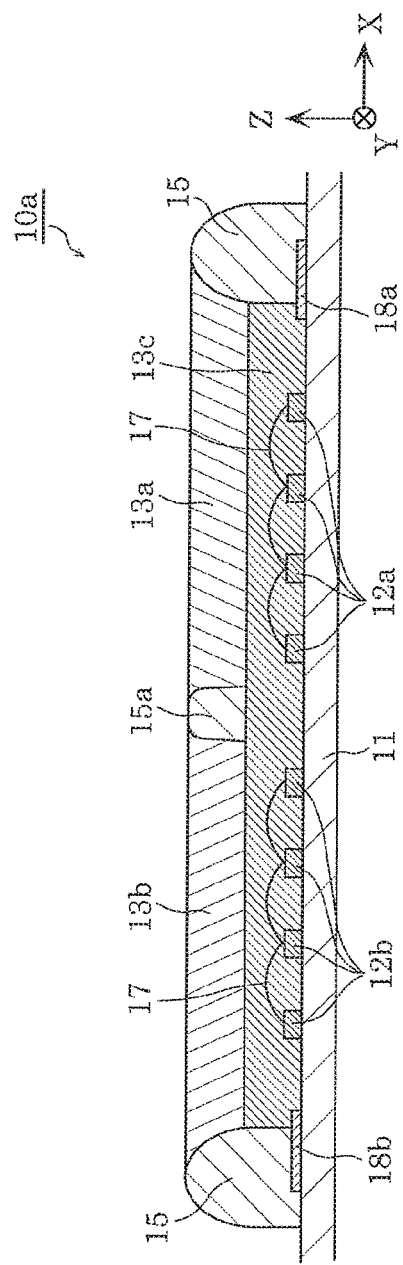
FIG. 6 is a schematic cross-sectional view of a light-emitting apparatus according to Variation 1.

In view of this, light-emitting apparatus 10a illustrated in FIG. 6 includes third sealant 13c which collectively seals first light-emitting element group 12a, second light-emitting element group 12b, third light-emitting element group 12c, and fourth light-emitting element group 12d, and first sealants 13a and second sealants 13b are on third sealant 13c. FIG. 6 is a schematic cross-sectional view of light-emitting apparatus 10a according to Variation 1.

Accordingly, first light-emitting element group 12a, second light-emitting element group 12b, third light-emitting element group 12c, and fourth light-emitting element group 12d are collectively sealed by third sealant 13c, and thus it is not necessary to determine the arrangement of components on substrate 11, taking into consideration a boundary position of the sealants like when two types of sealants are used for sealing. Thus, light-emitting apparatus 10 prevents a fall of reliability, and improves flexibility of the arrangements of bonding wires 17 and a wiring pattern disposed on substrate 11.

Note that the base material of third sealant 13c is, for example, a methyl silicone resin, but may be an epoxy resin or urea resin, for instance. Third sealant 13c does not include phosphors, but may include phosphors such as yellow phosphors 14y and red phosphors 14r.

[Variation 2: Another Variation of Stack Structure]

Figure 7:
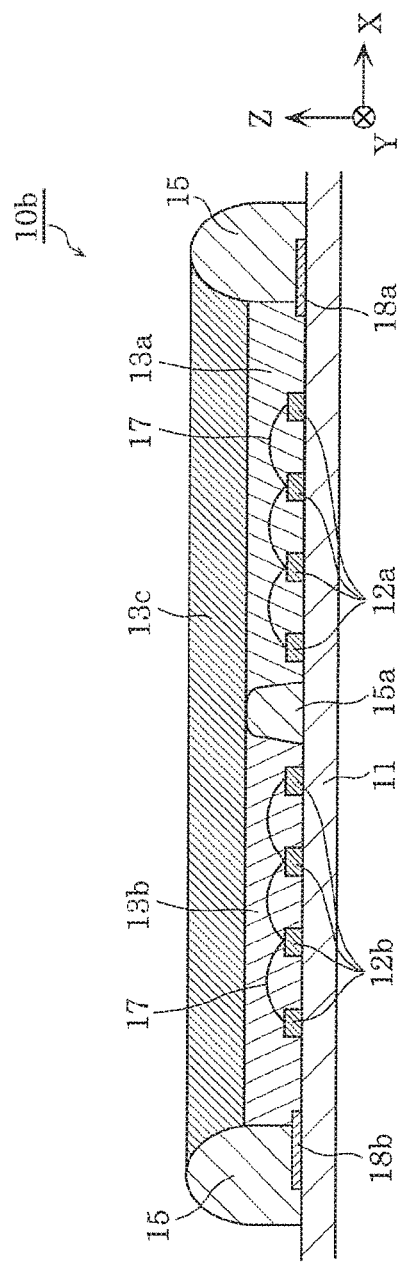
FIG. 7 is a schematic cross-sectional view of a light-emitting apparatus according to Variation 2.

In light-emitting apparatus 10, third sealant 13c may be on first sealants 13a and second sealants 13b, in order to protect first sealant 13a and second sealant 13b. FIG. 7 is a schematic cross-sectional view of a light-emitting apparatus according to Variation 2 as mentioned above.

As illustrated in FIG. 7, in light-emitting apparatus 10b according to Variation 2, first sealants 13a and second sealants 13b may include a methyl silicone resin as the base material, and third sealant 13c may include a phenyl silicone resin as a base material.

A methyl silicone resin has higher heat resistance and is less likely to be deteriorated than a phenyl silicone resin, whereas a methyl silicone resin has properties that gas barrier and light extraction efficiency are lower than a phenyl silicone resin.

In view of this, if a methyl silicone resin having high heat resistance is used for the base material of first sealant 13a and second sealant 13b near LED chips 12, and a phenyl silicone resin is used for the base material of third sealant 13c distant from LED chips 12, heat resistance, gas barrier properties, and light extraction efficiency are all secured.

Note that in both the cases of Variations 1 and 2 described above, first partitions 15a are located between first light-emitting element group 12a and second light-emitting element group 12b and between third light-emitting element group 12c and fourth light-emitting element group 12d, in a plan view. Similarly, in both the cases of Variations 1 and 2 described above, second partitions 15b are located between first light-emitting element group 12a and fourth light-emitting element group 12d and between second light-emitting element group 12b and third light-emitting element groups 12c, in a plan view.

[Variation 3: Variation of Annular Wall and Partition]

In the above embodiment, annular wall 15, first partitions 15a, and second partitions 15b are formed using white resin, yet annular wall 15, first partitions 15a, and second partitions 15b may be formed using black resin. Annular wall 15, first partitions 15a, and second partitions 15b formed using black resin absorb light, and thus may be effective when light reflected by annular wall 15, first partitions 15a, and second partitions 15b is unnecessary light (stray light). Note that black resin is achieved by, for example, adding carbon powder to the base material such as silicone.

Figure 8:
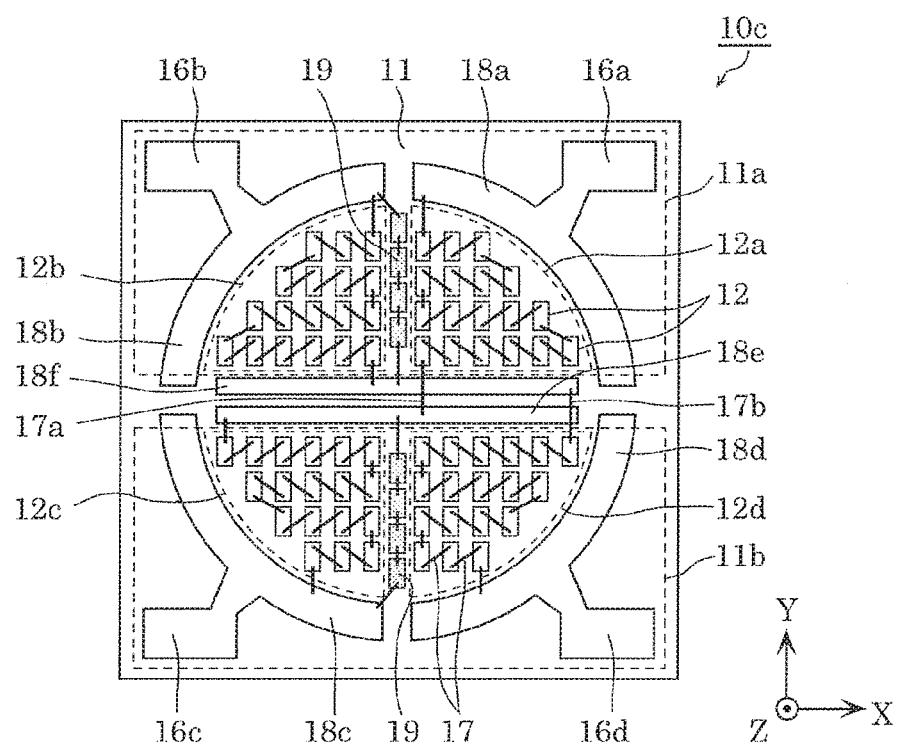
FIG. 8 is a plan view illustrating an internal structure of a light-emitting apparatus according to Variation 3.
Figure 9:
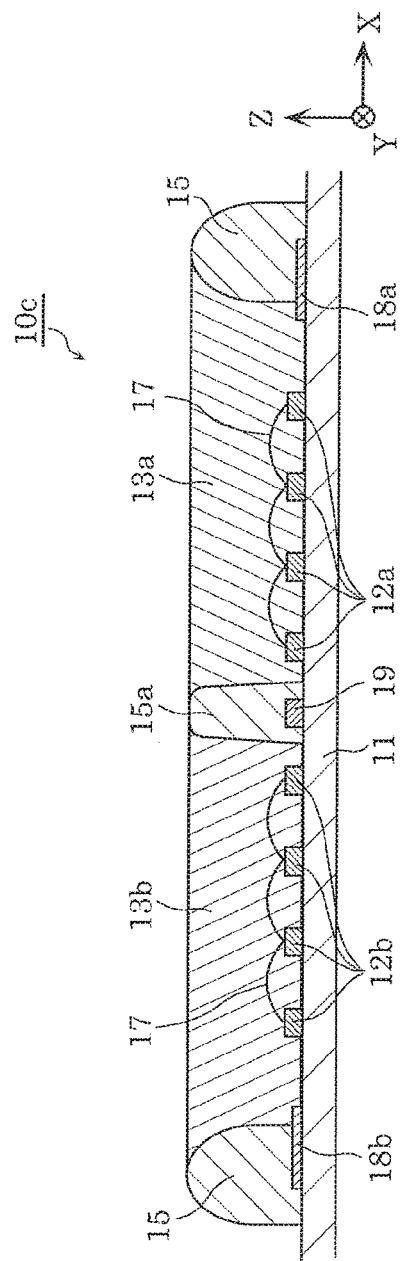
FIG. 9 is a schematic cross-sectional view of the light-emitting apparatus according to Variation 3.

Annular wall 15, first partitions 15a and second partitions 15b may be formed using light-transmitting resin, similarly to the base material of first sealant 13a, for instance. In this case, an LED chip may be disposed in at least one of annular wall 15, first partitions 15a, and second partitions 15b. FIG. 8 is a plan view illustrating an internal structure of a light-emitting apparatus according to Variation 3 as mentioned above. FIG. 9 is a schematic cross-sectional view of a light-emitting apparatus according to Variation 3. Note that first sealant 13a, second sealant 13b, annular wall 15, first partitions 15a, and second partitions 15b are omitted from FIG. 8.

As illustrated in FIGS. 8 and 9, light-emitting apparatus 10c according to Variation 3 includes LED chips 19 which are disposed on substrate 11, and emit light having a different color from the color of light emitted by LED chips 12. Note that FIG. 9 is a cross-sectional view of light-emitting apparatus 10c corresponding to FIG. 4.

LED chips 19 are, for example, red LED chips formed using an AlGaInP material and having an emission peak wavelength of at least 600 nm and at most 640 nm. Plural LED chips 19 are disposed in each of first region 11a and second region 11b.

LED chips 19 are disposed side by side in the first direction between first light-emitting element group 12a and second light-emitting element group 12b in first region 11a. LED chips 19 disposed in first region 11a are sealed by first partition 15a located between first light-emitting element group 12a and second light-emitting element group 12b. Specifically, LED chips 19 are disposed inside first partition 15a located between first light-emitting element group 12a and second light-emitting element group 12b.

LED chips 19 disposed in first region 11a are connected in series by bonding wires 17. An end of LED chips 19 disposed in first region 11a is electrically connected with second line 18b by bonding wire 17, and the other end of LED chips 19 disposed in first region 11a is electrically connected with second relay brie 18f by bonding wire 17.

Accordingly, if DC power is supplied between second terminal 11b and fourth terminal 16d, LED chips 19 disposed in first region 11a emit light, in addition to second light-emitting element group 12b and fourth light-emitting element group 12d. Accordingly, light-emitting apparatus 10c can improve reproducibility of a red color. Specifically, special color rendering index R9 of white light emitted by light-emitting apparatus 10c is improved.

Similarly, LED chips 19 are disposed side by side in the first direction between third light-emitting element group 12c and fourth light-emitting element group 12d in second region 11b. LED chips 19 disposed in second region 11b are sealed by first partition 15a located between third light-emitting element group 12c and fourth light-emitting element group 12d. Specifically, LED chips 19 are disposed inside first partition 15a located between third light-emitting element group 12c and fourth light-emitting element group 12d.

LED chips 19 disposed in second region 11b are connected in series by bonding wires 17. An end of LED chips 19 disposed in second region 11b is electrically connected with third line 18c by bonding wire 17, and the other end of LED chips 19 disposed in second region 11b is electrically connected with first relay line 18e by bonding wire 17.

Accordingly, if DC power is supplied between first terminal 16a and third terminal 16c, LED chips 19 disposed in second region 11b emit light, in addition to first light-emitting element group 12a and third light-emitting element group 12c. Accordingly, light-emitting apparatus 10c can improve reproducibility of a red color. Specifically, special color rendering index R9 of white light emitted by light-emitting apparatus 10c is improved.

Note that annular wall 15, first partitions 15a, and second partitions 15b do not need to be formed using the same resin, and for example, annular wall 15 may be formed using white resin while first partitions 15a and second partitions 15b may be formed using light-transmitting resin.

[Variation 4: Variation of Method of Connecting LED Chips]

Figure 10:
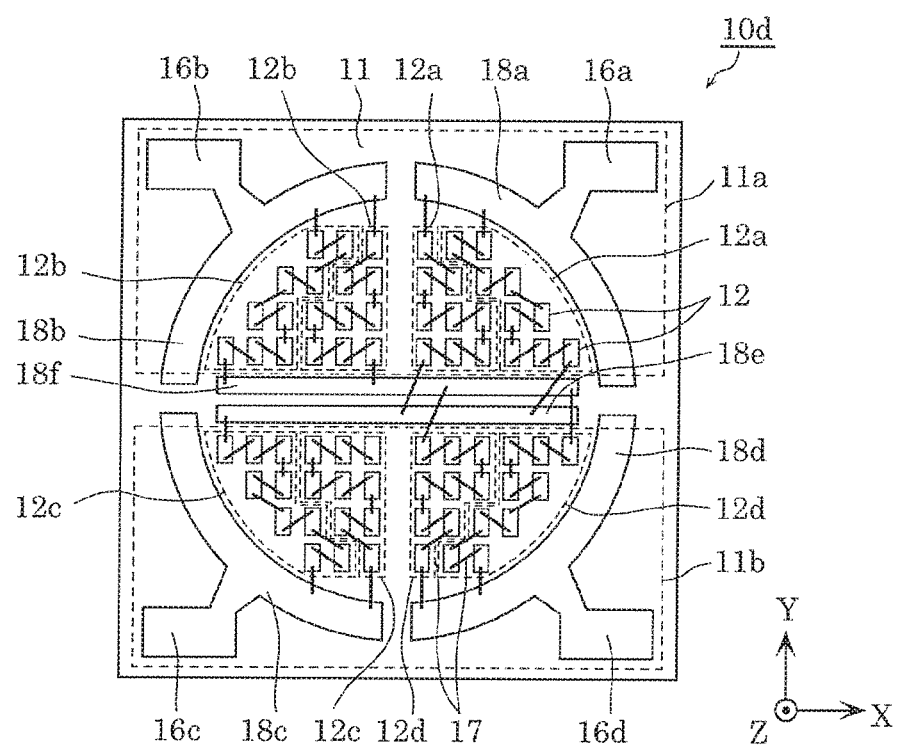
FIG. 10 is a plan view illustrating an internal structure of a light-emitting apparatus according Variation 4.

In the above embodiment, light-emitting apparatus 10 includes single first light-emitting element group 12a, single second light-emitting element group 12b, single third light-emitting element group 12c, and single fourth light-emitting element group 12d, but may include a plurality of first light-emitting element groups 12a, a plurality of second light-emitting element groups 12b, a plurality of third light-emitting element groups 12c, and a plurality of fourth light-emitting element groups 12d. FIG. 10 is a plan view illustrating an internal structure of a light-emitting apparatus according to Variation 4 as described above. Note that first sealant 13a, second sealant 13b, annular wall 15, first partitions 15a, and second partitions 15b are omitted from FIG. 10.

As illustrated in FIG. 10, light-emitting apparatus 10d according to Variation 4 includes two first light-emitting element groups 12a, two second light-emitting element groups 12b, two third light-emitting element groups 12c, and two fourth light-emitting element groups 12d. First light-emitting element groups 12a, second light-emitting element groups 12b, third light-emitting element groups 12c, and fourth light-emitting element groups 12d are each formed, by connecting LED chips 12 in series with bonding wires 17 using chip-to-chip bonding.

Two first light-emitting element groups 12a are each electrically connected with first terminal 16a and first relay line 18e. Specifically, two first light-emitting element groups 12a are connected in parallel.

Two second light-emitting element groups 12b are each electrically connected with second terminal 16b and second relay line 18f. Specifically, two second light-emitting element groups 12b are connected in parallel.

Two third light-emitting element groups 12c are each electrically connected with third terminal 16c and first relay line 18e. Specifically, two third light-emitting element groups 12c are connected in parallel.

Two fourth light-emitting element groups 12d are each electrically connected with fourth terminal 16d and second relay line 18f. Specifically, two fourth light-emitting element groups 12d are connected in parallel.

As described above, light-emitting apparatus 10d may include a plurality of first light-emitting element groups 12a, a plurality of second light-emitting element groups 12b, a plurality of third light-emitting element groups 12c, and a plurality of fourth light-emitting element groups 12d. In particular, when first relay line 18e and second relay line 18f extend parallel to each other in the second direction (which is the longitudinal direction), the positions on single first relay line 18e (or second relay line 18f) where bonding wires 17 are connected are readily shifted in the second direction. In other words, bonding wires 17 are readily connected with single first relay line 18e (or second relay line 18f). Accordingly, first relay line 18e and second relay line 18f which extend parallel to each other in the second direction are suitable for connecting light-emitting, element groups in parallel.

[Variation 5: Variation of Relay Line]

Figure 11:
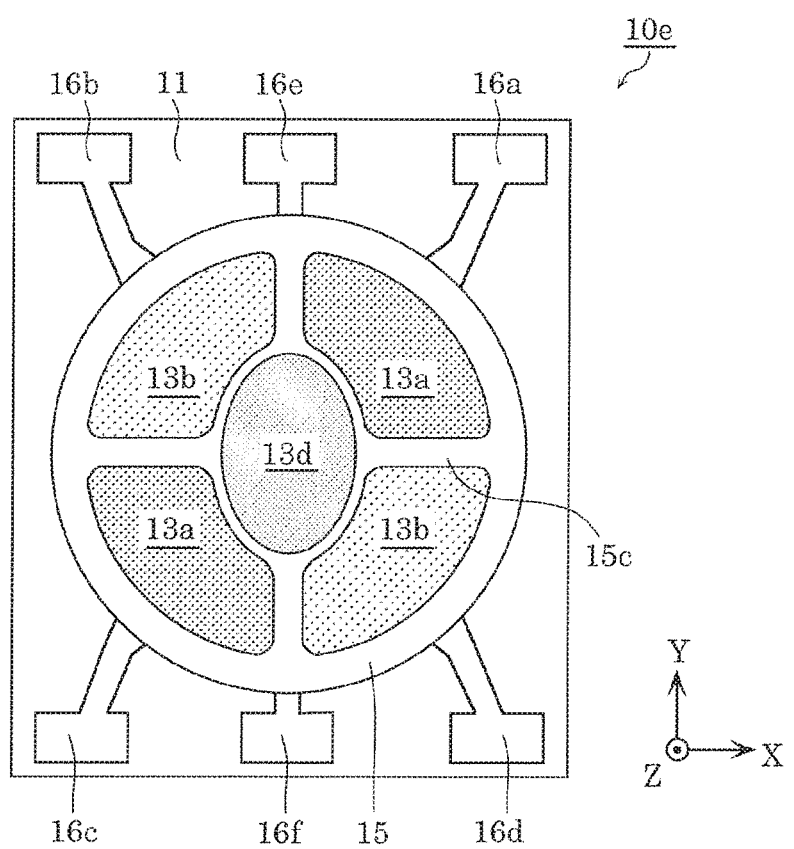
FIG. 11 is a plan view of a light-emitting apparatus according to Variation 5.

In light-emitting apparatus 10, first relay line 18e and second relay line 18f extend entirely parallel to each other in the second direction, yet may at least partially extend parallel to each other. FIG. 11 is a plan view of a light-emitting apparatus according to Variation 5 as mentioned above, and FIG. 12 is a plan view illustrating an internal structure of the light-emitting apparatus according to Variation 5. Note that first sealants 13a, second sealants 13b, fourth sealant 13d, annular wall 15, and partitions 15c are omitted from FIG. 12.

Figure 12:
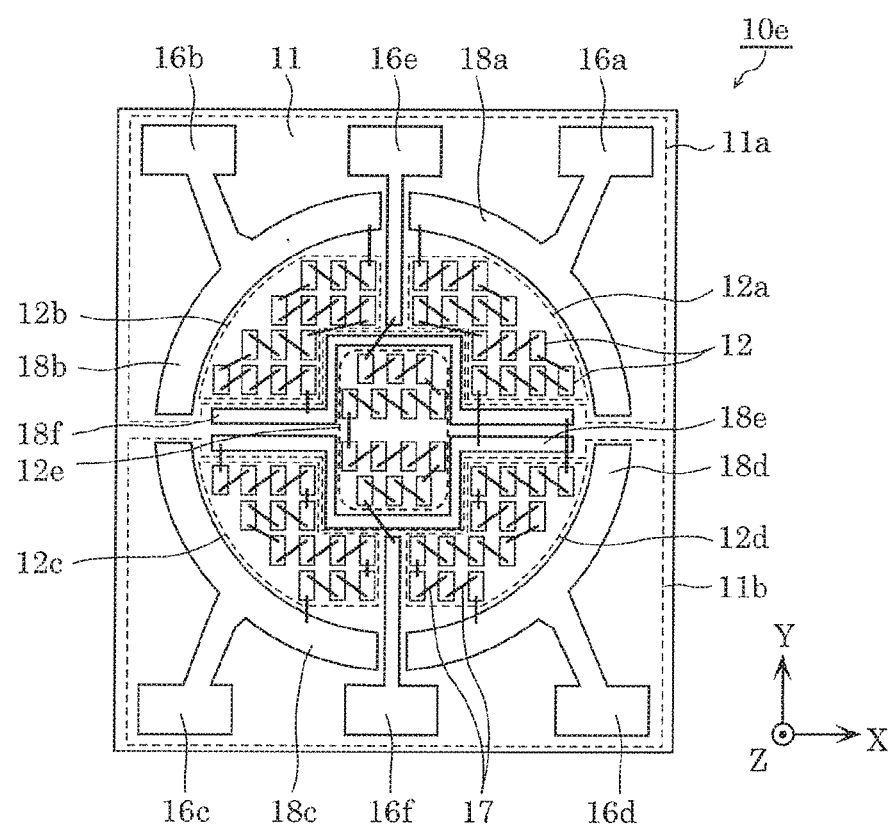
FIG. 12 is a plan view illustrating an internal structure of the light-emitting apparatus according to Variation 5.

As illustrated in FIGS. 11 and 12, light-emitting apparatus 10e according to Variation 5 includes fifth light-emitting element group 12e, in addition to first light-emitting element group 12a, second light-emitting element group 12b, third light-emitting element group 12c, and fourth light-emitting element group 12d.

Fifth light-emitting element group 12e is formed by connecting LED chips 12 in series with bonding wires 17 using chip-to-chip bonding. An end of fifth light-emitting element group 12e is electrically connected with fifth terminal 16e, and the other end of fifth light-emitting element group 12e is electrically connected with sixth terminal 16f. Fifth terminal 16e and sixth terminal 16f form a pair of terminals for supplying power to fifth light-emitting element group 12e, and DC power, for example, is supplied between fifth terminal 16e, and sixth terminal 16f. Thus, one of fifth terminal 16e and sixth terminal 16f is an anode terminal, and the other is a cathode terminal. Fifth terminal 16e is disposed between first terminal 16a and second terminal 16b, and sixth terminal 16f is disposed between third terminal 16c and fourth terminal 16d.

Fifth light-emitting element group 12e is disposed in the center on substrate H, and sealed by fourth sealant 13d. Fourth sealant 13d is made of light-transmitting resin material (base material) which includes phosphors. The base material of fourth sealant 13d is, for example, a methyl silicone resin, but may be an epoxy resin or a urea resin. Fourth sealant 13d includes yellow phosphors 14y and red phosphors 14r, for example. Accordingly, white light is emitted through fourth sealant 13d.

The color temperature of the white light emitted through fourth sealant 13d is different from, for example, both the color temperature of white light emitted through first sealant 13a and the color temperature of white light emitted through second sealant 13b. The color temperature of white light emitted from fourth sealant 13d is, for example, set to 5000 K, by adjusting contents of yellow phosphors 14y and red phosphors 14r included in fourth sealant 13d.

As described above, in light-emitting apparatus 10e, fifth light-emitting element group 12e is disposed in the center on substrate 11, and thus first relay line 18e and second relay line 18f are disposed, avoiding fifth light-emitting element group 12e. In other words, fifth light-emitting element group 12e is disposed between first relay line 18e and second relay line 18f on substrate 11. Accordingly, first relay line 18e and second relay line 18f do not extend parallel to each other in a portion in which fifth light-emitting element group 12e is located. Such first relay line 18e and second relay line 18f prevent the structure of connecting light-emitting element groups from being complicated.

[Variation 6: The Number of Relay Lines]

Figure 13:
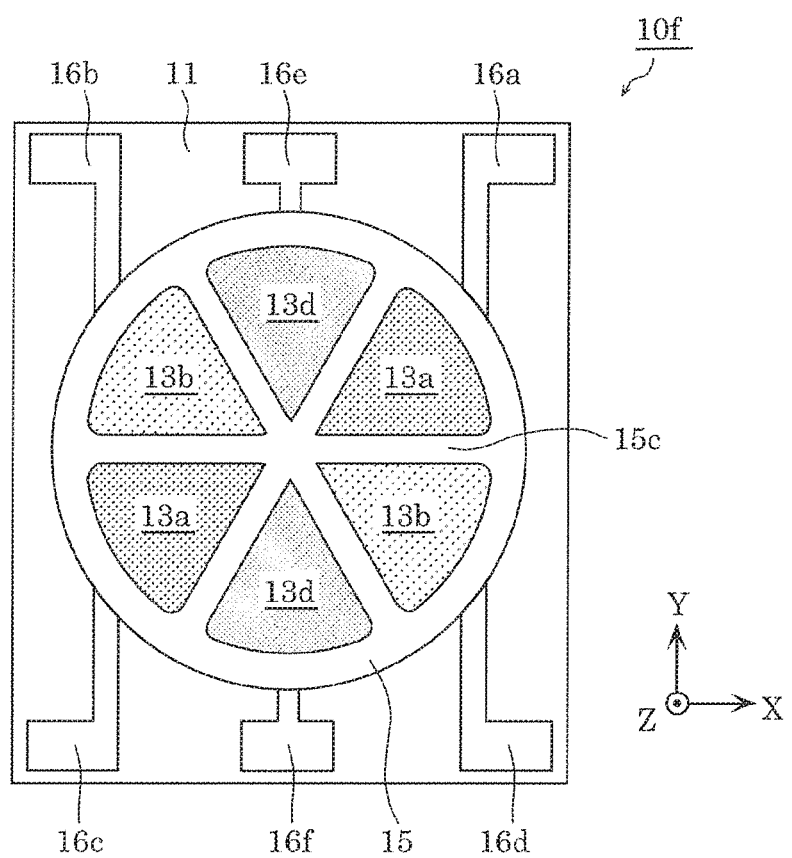
FIG. 13 is a plan view of a light-emitting apparatus according to Variation 6.
Figure 14:
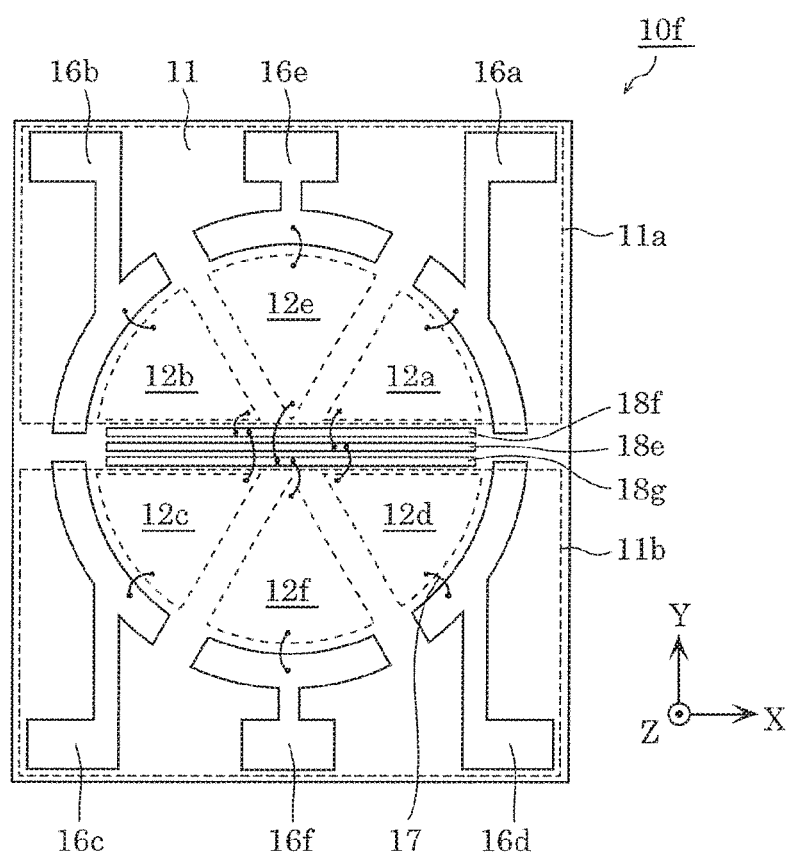
FIG. 14 is a plan view illustrating internal structure of the light-emitting apparatus according to Variation 6.

The number of relay lines is not limited to two. The number of relay lines depends on the number of pairs of light-emitting element groups which electrically need to be connected since one of a pair is disposed in first region 11a and the other of the pair is disposed in second region 11b. For example, three relay lines 18 are disposed in light-emitting apparatus 10f illustrated in FIGS. 13 and 14. FIG. 13 is a plan view of light-emitting apparatus 10f according to Variation 6, and FIG. 14 is a plan view illustrating an internal structure of light-emitting apparatus 10f according to Variation 6. Note that in the plan view of FIG. 14, light-emitting element groups are schematically illustrated by dashed lines.

As illustrated in FIGS. 13 and 14, light-emitting apparatus 10f according to Variation 6 includes fifth light-emitting element group 12e and sixth light-emitting element group 12f, in addition to first light-emitting element group 12a, second light-emitting element group 12b, third light-emitting element group 12c, and fourth light-emitting element group 12d.

Fifth light-emitting element group 12e is disposed between first light-emitting element group 12a and second light-emitting element group 12b in first region 11a, and is sealed by fourth sealant 13d. Sixth light-emitting element group 12f is disposed between third light-emitting element group 12c and fourth light-emitting element group 12d in second region 11b, and sealed by fourth sealant 13d.

In light-emitting apparatus 10f, fifth light-emitting element group 12e and sixth light-emitting element group 12f emit light when DC power is supplied between fifth terminal 16e disposed in first region 11a and sixth terminal 16f disposed in second region 11b. In order to achieve such light emission, light-emitting apparatus 10f includes third relay line 18g for electrically connecting fifth light-emitting element group 12e and sixth light-emitting element group 12f, in addition to first relay line 18e and second relay line 18f. Specifically, light-emitting apparatus 10f includes three relay lines.

Note that since fifth light emitting element group 12e and sixth light-emitting element group 12f are disposed side by side in the first direction in light-emitting apparatus 10f, fifth light-emitting element, group 12e and sixth light-emitting element group 12f can be directly electrically connected by bonding wire 17. In this case, third relay line 18g is unnecessary. Thus, the number of pairs of light-emitting element groups which electrically need to be connected does not necessarily need to match the number of relay lines.

Figure 15:
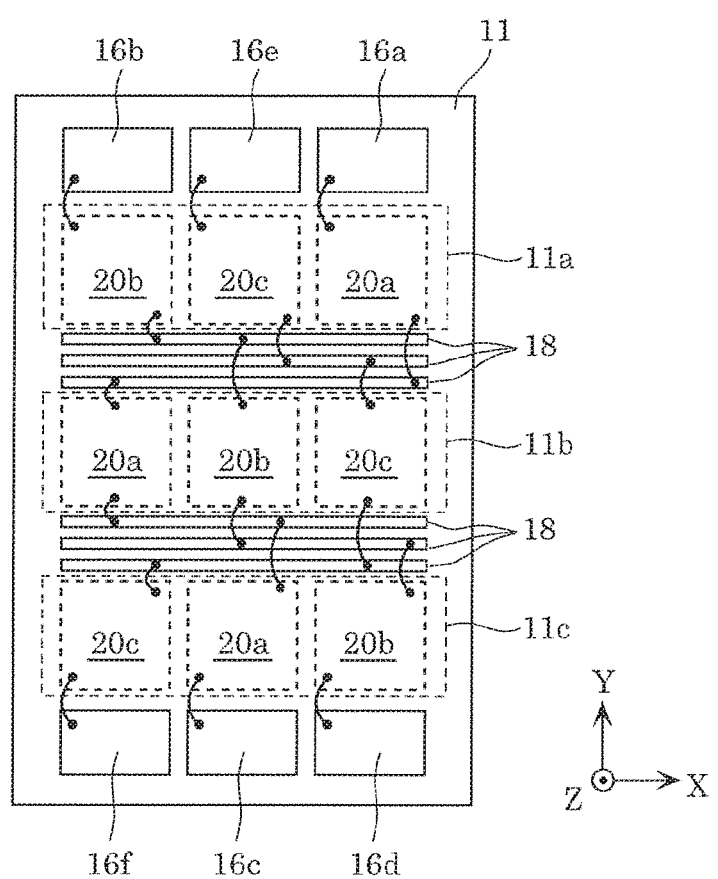
FIG. 15 is an explanatory diagram illustrating an example in which light-emitting element groups disposed in three regions are electrically connected by relay lines.

In the above embodiment, light-emitting element groups disposed in two regions, namely, first region 11a and second region 11b, are electrically connected by a relay line, yet light-emitting element groups disposed in three or more regions may be electrically connected by relay lines. FIG. 15 is an explanatory diagram of an example in which light-emitting element groups disposed in three regions are electrically connected by relay lines.

In FIG. 15, substrate 11 includes third region 11c, in addition to first region 11a and second region 11b. Light-emitting element groups 20a disposed one in each of first region 11a, second region 11b, and third region 11c are electrically connected by relay line 18 located between first region 11a and second region 11b and relay line 18 located between second region 11b and third region 11c, and all emit, light when. DC power is supplied between first terminal 16a and third terminal 16c. Similarly, light-emitting element groups 20b disposed one in each of first region 11a, second region 11b, and third region 11c are electrically connected by relay line 18 located between first region 11a and second region 11b and relay line 18 located between second region 11b and third region 11c, and all emit light when DC power is supplied between second terminal 16b and fourth terminal 16d. Light-emitting element groups 20c disposed one in each of first region 11a, second region 11b, and third region 11c are electrically connected by relay line 18 located between first region 11a and second region 11b and relay line 18 located between second region 11b and third region 11c, and all emit light when DC power is supplied between fifth terminal 16e and sixth terminal 16f.

In the example in FIG. 15, three relay lines 18 are disposed between first region 11a and second region 11b, and three relay lines 18 are disposed between second region 11b and third region 11c. Specifically, a total number of relay lines 18 is the number (six in the example in FIG. 15) obtained by multiplying the number of sets of light-emitting element groups which need to be electrically connected (in the example in FIG. 15, three sets each including light-emitting element group 20a, light-emitting element group 20b, and light-emitting element group 20c) by the number of boundaries between regions (two in the example in FIG. 15).

[Advantageous Effects and Others]

As described above, light-emitting apparatus 10 includes: substrate 11 including first region 11a and second region 11b aligned in a first direction; first light-emitting element group 12a and second light-emitting element group 12b disposed on first region 11a on substrate 11; and third light-emitting element group 12c and fourth light-emitting element group 12d disposed on second region 11b on substrate 11. Light-emitting apparatus 10 includes first terminal 16a, second terminal 16b, third terminal 16c, and fourth terminal 16d disposed on substrate 11. Further, light-emitting apparatus 10 includes first relay line 18e and second relay line 18f disposed in a region between first region 11a and second region 11b on substrate 11, and extending at least partially parallel to each other in a second direction crossing the first direction. First light-emitting element group 12a is electrically connected with first terminal 16a and first relay line 18e, second light-emitting element group 12b is electrically connected with second terminal 16a and second relay line 18f, third light-emitting element group 12c is electrically connected with third terminal 16c and first relay line 18e, and fourth light-emitting element group 12d is electrically connected with fourth terminal 16d and second relay line 18f.

Such first relay line 18e and second relay line 18f prevent the structure of connecting a plurality of light-emitting element groups from being complicated, or specifically, prevent bonding wires 17 from three-dimensionally crossing. Thus, light emitting device 10 in which a plurality of light-emitting element groups are readily electrically connected is achieved.

Light-emitting apparatus 10 may include a plurality of first light-emitting element groups 12a, a plurality of second light-emitting element groups 12b, a plurality of third light-emitting element groups 12c, and a plurality of fourth light-emitting element groups 12d, similarly to light-emitting apparatus 10d.

Accordingly, one first relay line 18e can connect a plurality of first light-emitting element groups 12a in parallel, a plurality of third light-emitting element groups 12c in parallel, and first light-emitting element groups 12a and third light-emitting element groups 12c in series. One second relay line 18f can connect a plurality of second light-emitting element groups 12b in parallel, a plurality of fourth light-emitting element groups 12d in parallel, and second light-emitting element groups 12b and fourth light-emitting element groups 12d in series. In other words, when a plurality of first light-emitting element groups 12a, a plurality of second light-emitting element groups 12b, a plurality of third light-emitting element groups 12c, and a plurality of fourth light-emitting element groups 12d are connected in parallel group-by-group, each set of the light-emitting element groups are electrically connected via first relay line 18e and second relay line 18f, and thus the connecting structure is further simplified.

First relay line 18e may be closer to second region 11b than second relay line 18f is. First light-emitting element group 12a may be electrically connected with first relay line 18e via bonding wire 17a extending across second relay line 18f, and fourth light-emitting element group 12d may be electrically connected with second relay line 18f via bonding wire 17b extending across first relay line 18e. Bonding wire 17a is an example of the first metal line, and bonding wire 17b is an example of the second metal line.

Accordingly, light emitting device 10 readily electrically connects first light-emitting element group 12a and third light-emitting element group 12c, using a simple connecting structure in which bonding wire 17a extends across second relay line 18f. Accordingly, light emitting device 10 readily electrically connects second light-emitting element group 12b and fourth light-emitting element group 12d, using a simple connecting structure in which bonding wire 17b extends across second relay line 18e.

In first region 11a, first light-emitting element group 12a and second light-emitting element group 12b may be disposed adjacently along the second direction, the second direction crossing the first direction in which first region 11a and second region 11b are aligned. In second region 11b, third light-emitting element group 12c and fourth light-emitting element group 12d may be disposed adjacently along the second direction. A third direction in which first light-emitting element group 12a and third light-emitting element group 12c are aligned may cross a fourth direction in which second light-emitting element group 12b and fourth light-emitting element group 12d are aligned.

Accordingly, the direction in which first light-emitting element group 12a and third light-emitting element group 12c are aligned crosses the direction in which second light-emitting element group 12b and fourth light-emitting element group 12d are aligned, and thus even if bonding wires 17 are likely to three-dimensionally cross, first relay line 18e and second relay line 18f prevent a connecting structure of a plurality of light-emitting element groups from being complicated.

First light-emitting element group 12a and fourth light-emitting element group 12d may be disposed adjacently in the first direction, and second light-emitting element group 12b and third light-emitting element group 12c may be disposed adjacently in the first direction.

Accordingly, even if electric connection is difficult when first light-emitting element group 12a and third light-emitting element group 12c are not aligned in the first direction and second light-emitting element group 12b and fourth light-emitting element group 12d are not aligned in the first direction, first relay line 18e and second relay line 18f prevent a connecting structure of a plurality of light-emitting element groups from being complicated.

Light-emitting apparatus 10 may further include first partitions 15a located between first light-emitting element group 12a and second light-emitting element group 12b, and between third light-emitting element group 12c and fourth light-emitting element group 12d, in a plan view. Light-emitting apparatus 10 may further include second partitions 15b located between first light-emitting element group 12a and fourth light-emitting element group 12d, and between second light-emitting element group 12b and third light-emitting element group 12c, in the plan view.

Accordingly, for example, if sealants are separated by first partitions 15a and second partitions 15b, a portion of light emitted from one sealant is prevented from entering another sealant and re-exciting phosphors in the other sealant. Preventing re-excitation avoids a decrease in light extraction efficiency.

In the plan view, second partitions 15b may overlap a region between first relay line 18e and second relay line 18f.

In such a manner, second partitions 15b may be disposed, overlapping a region between first relay line 18e and second relay line 18f in a plan view, for example.

Light-emitting apparatus 10 may further include: first sealant 13a above first light-emitting element group 12a and third light-emitting element group 12c; and second sealant 13b above second light-emitting element group 12b and fourth light-emitting element group 12d.

This protects first light-emitting element group 12a, second light-emitting element group 12b, third light-emitting element group 12c, and fourth light-emitting element group 12d from dust, moisture, external force, and others.

Light-emitting apparatus 10 may further include: third sealant 13c which collectively seals first light-emitting element group 12a, second light-emitting element group 12b, third light-emitting element group 12e, and fourth light-emitting element group 12d. First sealant 13a and second sealant 13b may be over third sealant 13c.

Accordingly, bonding wire 17 and the wiring pattern on substrate 11 are prevented from extending across and covering over two or more types of sealants, and thus reliability of bonding wire 17, for instance, can be improved. Furthermore, it is not necessary to determine the arrangement of components on substrate 11, taking into consideration the boundary position of the sealants, and thus the flexibility in arranging a wiring pattern and bonding wires 17 on substrate 11 improves.

Light-emitting apparatus 10 may emit light having a first color when a voltage is applied between first terminal 16a and third terminal 16c, and emit light having a second color when a voltage is applied between second terminal 16b and fourth terminal 16d.

Accordingly, light emitting device the 10 can control the color of emitted light (control color adjustment).

Substrate 11 may have a quadrilateral shape in a plan view, and first terminal 16a, second terminal 16b, third terminal 16c, and fourth terminal 16d may be disposed one at each of corners of substrate 11.

Accordingly, light emitting device 1 and a lighting device which supplies light emitting device 10 with power for light emitting device 10 to emit light can be readily electrically connected via a terminal.

Light-emitting apparatus 10 may further include: first line 18a which is disposed on substrate 11, and electrically connects first light-emitting element group 12a and first terminal 16a; second line 18b which is disposed on substrate 11, and electrically connects second light-emitting element group 12b and second terminal 16b; third line 18c which is disposed on substrate 11, and electrically connects third light-emitting element group 12c and third terminal 16c; and fourth line 18d which is disposed on substrate 11, and electrically connects fourth light-emitting element group 12d and fourth terminal 16d.

Accordingly, each light-emitting element group is electrically connected with a terminal via a line, and thus the number of bonding wires 17 to be used can be reduced, and can simplify the connecting structure of light-emitting element groups.

Light-emitting apparatus 10 may further include: annular wall 15 externally surrounding first light-emitting element group 12a, second light-emitting element group 12b, third light-emitting element group 12c, and fourth light-emitting element group 12d. Each of first line 18a, second line 18b, third line 18c, and fourth line 18d may be at least partially disposed under annular wall 15 on substrate 11.

Accordingly, annular wall 15 can at least partially protect first line 18a, second line 18b, third line 18c, and fourth line 18d from dust, moisture, external force, and others.

A voltage having a same value may be applied to first terminal 16a and second terminal 16b. Similarly, a voltage having a same value may be applied to third terminal 16c and fourth terminal 16d.

Accordingly, a lighting device which is the same type as a lighting device (lighting circuit) which applies a voltage between first terminal 16a and third terminal 16c is applicable also to a lighting device which applies a voltage between second terminal 16b and fourth terminal 16d. This allows the two lighting devices to have a common configuration.

Embodiment 2

Figure 16:
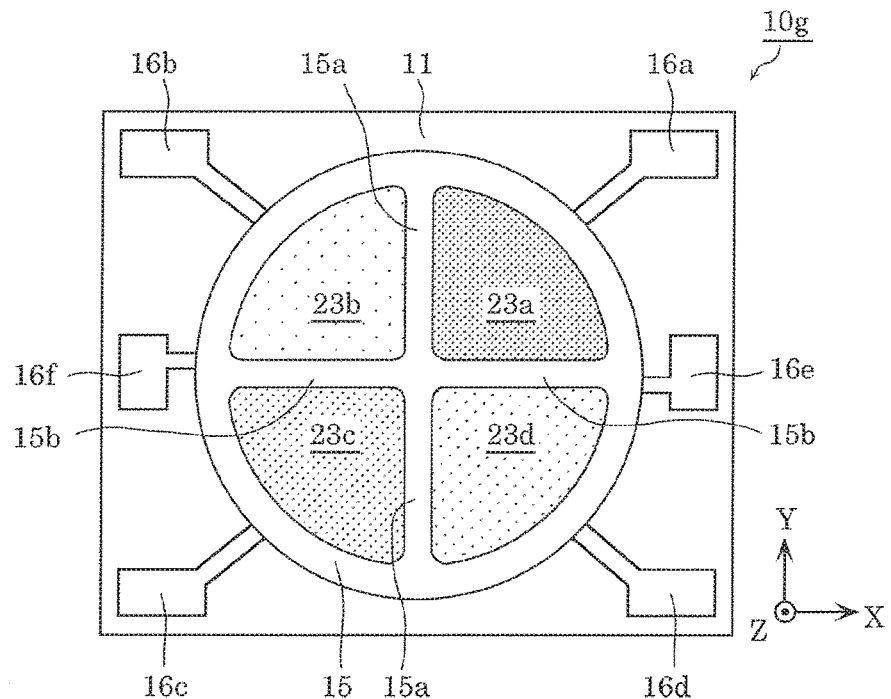
FIG. 16 is a plan view of a light-emitting apparatus according to Embodiment 2.
Figure 17:
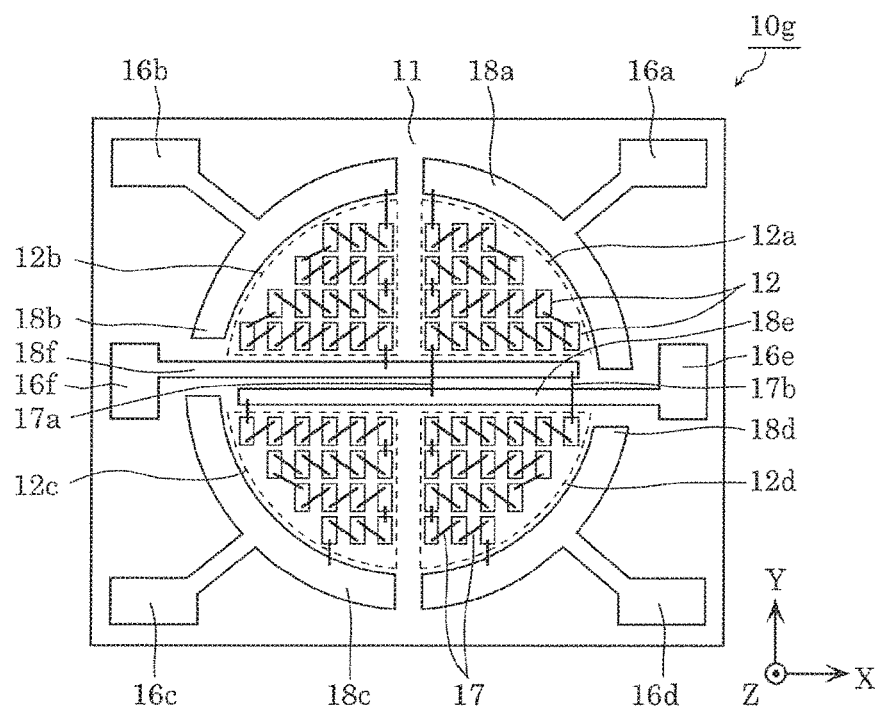
FIG. 17 is a plan view illustrating an internal structure of the light-emitting apparatus according to Embodiment 2.

Embodiment 2 describes a light-emitting apparatus which has a similar wiring structure to that of light-emitting apparatus 10. FIG. 16 is a plan view of a light-emitting apparatus according to Embodiment 2. FIG. 17 is a plan view illustrating an internal structure of the light-emitting apparatus according to Embodiment 2. Note that in Embodiment 2, a description focusing on differences from light-emitting apparatus 10 is given, and a description of a substantially same matter as that already described is omitted.

As illustrated in FIGS. 16 and 17, light-emitting apparatus 10g according to Embodiment 2 includes fifth terminal 16e integrally patterned with first relay line 18e. Fifth terminal 16e is connected with the end of first relay line 18e on the positive side of the X axis. Fifth terminal 16e is disposed between first terminal 16a and fourth terminal 16d on substrate 11.

Light-emitting apparatus 10g includes sixth terminal 16f integrally patterned with second relay line 18f. Sixth terminal 16f is connected with the end of second relay line 18f on the negative side of the X axis. Sixth terminal 16f is disposed between second terminal 16b and third terminal 16c on substrate 11.

In light-emitting apparatus 10g, light emissions of first light-emitting element group 12a, second light-emitting element group 12b, third light-emitting element group 12c, and fourth light-emitting element group 12d are independently controlled. Light emission of first light-emitting element group 12a is controlled by supplying DC power between first terminal 16a and fifth terminal 16e. Light emission of second light-emitting element group 12b is controlled by supplying DC power between second terminal 16b and sixth terminal 16f. Light emission of third light-emitting element group 12c is controlled by supplying DC power between third terminal 16c and fifth terminal 16e, and light emission of fourth light-emitting element group 12d is controlled by supplying DC power between fourth terminal 16d and sixth terminal 16f.

First light-emitting element group 12a is sealed by sealing member 23a, second light-emitting element group 12b is sealed by sealing member 23b, third light-emitting element group 12c is sealed by sealing member 23c, and fourth light-emitting element group 12d is sealed by sealing member 23d.

Sealing member 23a, sealing member 23b, sealing member 23c, and sealing member 23d have different contents of yellow phosphors 14y and red phosphors 14r. Thus, the color of light (first light color) emitted through sealing member 23a by first light-emitting element group 12a emitting light, the color of light (second light color) emitted through sealing member 23b by second light-emitting element group 12b emitting light, the color of light (third light color) emitted through sealing member 23c by third light-emitting element group 12c emitting light, and the color of light (fourth light color) emitted through sealing member 23d by fourth light-emitting element group 12d emitting light are different from one another.

Figure 18:
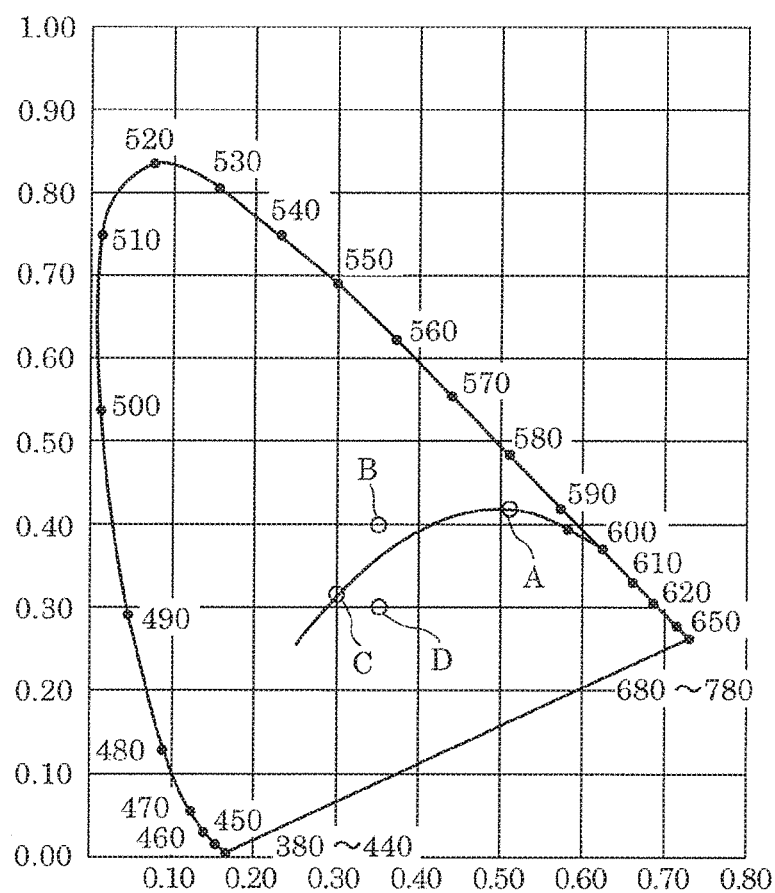
FIG. 18 is a schematic diagram illustrating chromaticity coordinates.

Here, the first light color, the second light color, the third light color, and the fourth light color have a positional relationship on chromaticity coordinates, as illustrated in FIG. 18. FIG. 18 is a schematic diagram illustrating chromaticity coordinates.

As illustrated in FIG. 18, first light color A and third light color C are both located on a blackbody locus (on an isanomal). First light color A has a color temperature lower than third light color C. The first light color is located at the coordinates indicating a color temperature of 2700 K on the blackbody locus, for example, and the second light color is located at the coordinates indicating a color temperature of 8000 K on the blackbody locus, for example.

Second light color B and fourth light color D are located on an isotemperature line, and the color deviation duv of second light color B has a positive value, whereas the color deviation duv of fourth light color D has a negative value. The third light color is located at, for example, coordinates indicating duv=±+0.2 on the isotemperature line at 5000 K, and the second light color is located at, for example, coordinates indicating duv=−0.2 on the isotemperature line at 5000 K.

In light emitting devices 10g described above, the color of light can be moved along the isanomal on chromaticity coordinates by adjusting light output (intensity of first light color A) of first light-emitting element group 12a and light output (intensity of third light color C) of third light-emitting element group 12c. In light emitting device 10g, the color of light can be moved along the isotemperature line on chromaticity coordinates by adjusting light output (intensity of second light color B) of second light-emitting element group 12b and light output (intensity of fourth light color D) of fourth light-emitting element group 12d.

Note that in order to achieve first light color A, second light color B, third light color C, and fourth light color D, sealing member 23a, sealing member 23b, sealing member 23c, and sealing member 23d may each include phosphors other than yellow phosphors 14y and red phosphors 14r.

In light emitting device 10g, first relay line 18e and second relay line 18f may be achieved as a single line. Even if first relay line 18e and second relay line 18f are achieved as a single line, light emission of first light-emitting element group 12a, second light-emitting element group 12b, third light-emitting element group 12c, and fourth light-emitting element group 12d can be independently controlled.

Embodiment 3

Figure 19:
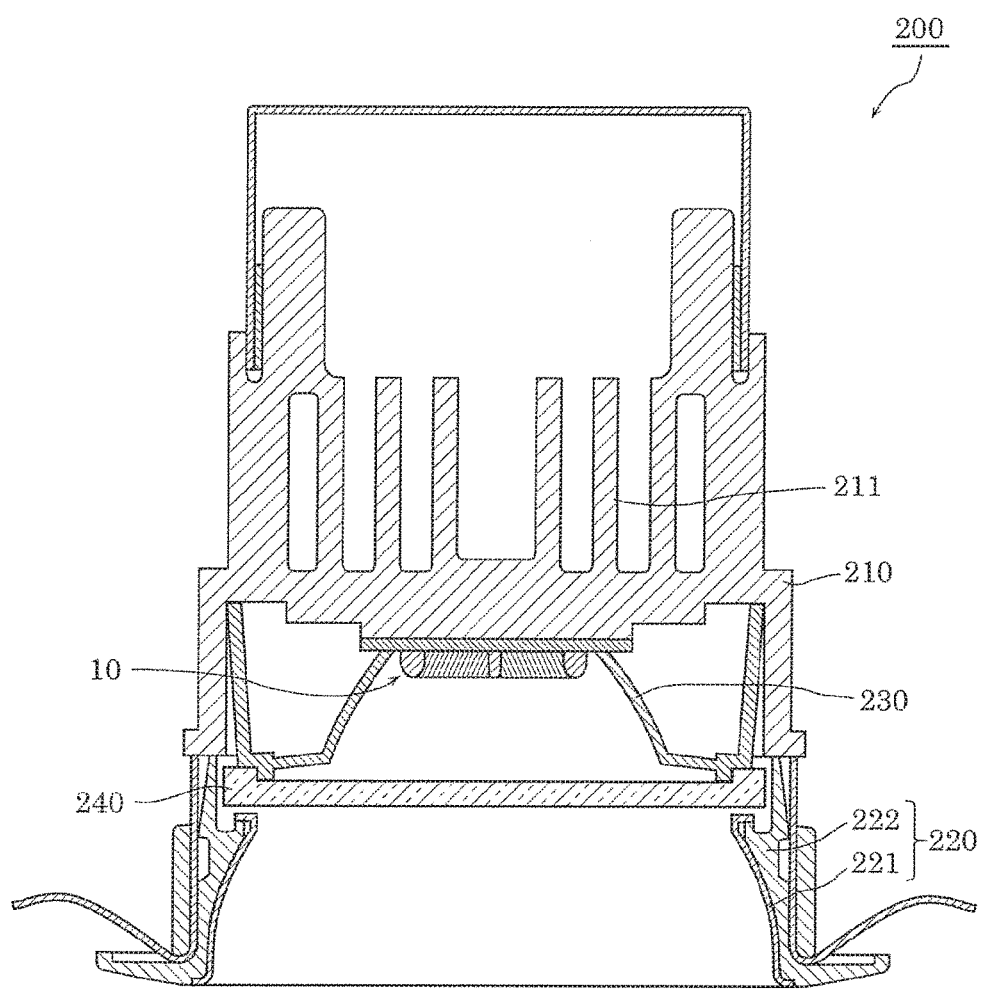
FIG. 19 is a cross-sectional view of an illumination apparatus according to Embodiment 3.
Figure 20:
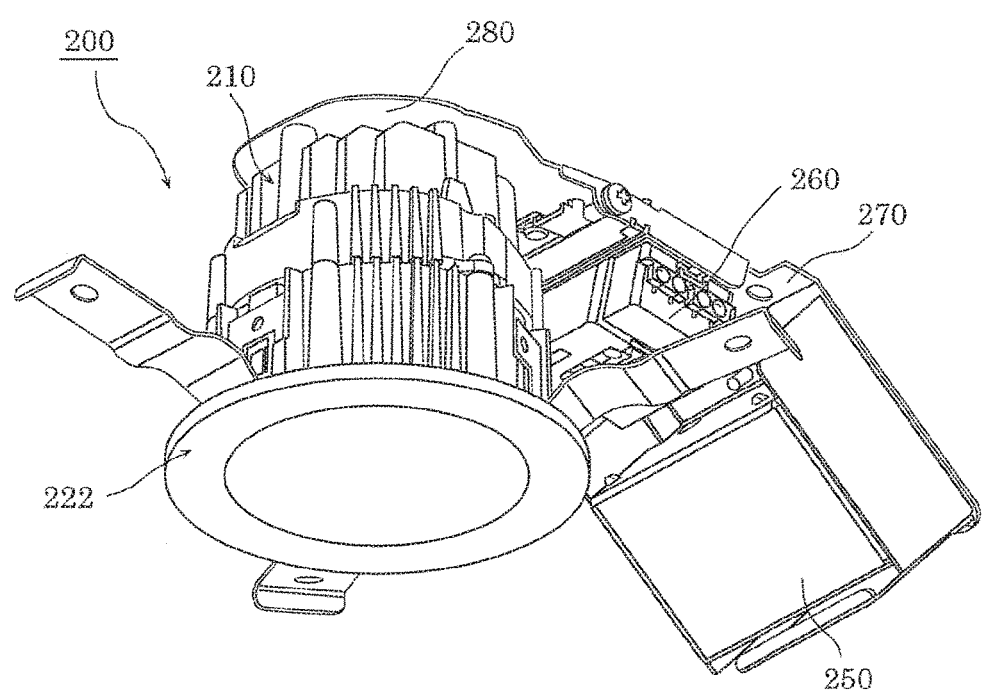
FIG. 20 is an external perspective view of the illumination apparatus according to Embodiment 3, and members in the periphery of the illumination apparatus.

The following describes an illumination apparatus according to Embodiment 3, with reference to FIGS. 19 and 20. FIG. 19 is a cross-sectional view of the illumination apparatus according to Embodiment 3. FIG. 20 is an external perspective view of the illumination apparatus according to Embodiment 3 and peripheral members of the illumination apparatus.

As illustrated in FIGS. 19 and 20, illumination apparatus 200 according to Embodiment 3 is, for example, a recessed lighting fixture such as a downlight, which is installed in the ceiling of a house, for instance, and emits light downward (toward a hallway, a wall, and others).

Illumination apparatus 200 includes light-emitting apparatus 10. Illumination apparatus 200 further includes: a device body having a cylindrical shape with a substantially closed end, which is obtained by combining base 210 and frame 220; and light reflector plate 230 and light-transmitting panel 240 which are disposed in the device body.

Base 210 is a mount to which light-emitting apparatus 10 is attached, and also serves as a heat sink which dissipates heat generated by light-emitting apparatus 10. Base 210 is formed into a substantially cylindrical shape using metal material, which is aluminum in Embodiment 3.

On the top portion (ceiling side portion) of base 210, radiator fins 211 protruding upward are disposed at constant intervals in one direction. Accordingly, heat generated by light-emitting apparatus 10 can be dissipated efficiently.

Frame 220 includes substantially cylindrical cone portion 221 having a reflective surface inside, and frame body 222 to which cone portion 221 is attached. Cone portion 221 is formed using metal material, and can be produced by, for example, drawing or pressing an aluminum alloy, for instance. Frame body 222 is formed using a hard resin material or a metal material. Frame 220 is fixed by frame body 222 being attached to base 210.

Light reflector plate 230 is a reflection member having a ring frame shape (funnel form) and an internal-surface reflection function. Light reflector plate 230 can be formed, for example using a metal material, such as aluminum. Note that light reflector plate 230 may be formed using a hard white resin material, rather than a metal material.

Light transmitting panel 240 is a light transmitting member which has light diffusibility and light transmissibility. Light transmitting panel 240 is a flat plate disposed between light reflector plate 230 and frame 220, and is attached to light reflector plate 230. Light transmitting panel 240 can be formed into a disc shape using transparent resin material such as acrylic resin and polycarbonate resin, for example.

Note that illumination apparatus 200 may not include light transmitting panel 240. The luminous flux of light emitted from illumination apparatus 200 can be improved by excluding light transmitting panel 240.

As illustrated in FIG. 20, in illumination apparatus 200, lighting apparatus 250 which supplies light-emitting apparatus 10 with power for light-emitting apparatus 10 to emit light, and terminal block 260 which relays AC power from a commercial power supply to lighting apparatus 250 are connected to light-emitting apparatus 10. Specifically, lighting apparatus 250 converts AC power relayed from terminal block 260 into DC power, and outputs the DC power to light-emitting apparatus 10. Lighting apparatus 250 includes a controller which independently controls DC power supplied between first terminal 16a and third terminal 16c, and DC power supplied between second terminal 16b and fourth terminal 16d. The controller is achieved by a microcomputer, a processor, or a dedicated circuit.

Lighting apparatus 250 and terminal block 260 are fixed to attachment plate 270 provided separately from the device body. Attachment plate 270 is formed by bending a quadrilateral flat member made of a metal material, and lighting apparatus 250 is fixed on the undersurface of attachment plate 270 at an end portion in the longitudinal direction while terminal block 260 is fixed to the undersurface at the other end portion. Attachment plate 270 is connected with top plate 280 fixed to the top portion of base 210 of the device body.

As described above, illumination apparatus 200 includes light-emitting apparatus 10, and lighting apparatus 250 which supplies light-emitting apparatus 10 with power for light-emitting apparatus 10 to emit light. Also in such illumination apparatus 200, a plurality of light-emitting element groups in light-emitting apparatus 10 are readily electrically connected. Note that illumination apparatus 200 may include one of light-emitting apparatuses 10a to 10g, instead of light-emitting apparatus 10.

Note that although a downlight has been described as an example of the illumination apparatus in Embodiment 3, the present disclosure may be achieved as other illumination apparatuses such as a spotlight.

Other Embodiments

The above completes description of the light emitting apparatuses and the illumination apparatus according to the embodiments, yet the present disclosure is not limited to the embodiments above.

In the above embodiments, the light-emitting apparatus outputs while light by combining LED chips which emit blue light with yellow phosphors and red phosphors, yet a configuration for outputting white light is not limited to this.

For example, LED chips which emit blue light may be combined with red phosphors and green phosphors. Specifically, the first sealant and the second sealant may each include red phosphors and green phosphors. Alternatively, an ultraviolet LED chip which outputs ultraviolet light having a shorter wavelength than an LED chip which emits blue light may be combined with blue phosphors, green phosphors, and red phosphors which emit blue light, red light, and green light, respectively, by being excited mainly by ultraviolet light. Specifically, an LED chip may emit ultraviolet light, and the first sealant and the second sealant may each include blue phosphors, green phosphors, and red phosphors.

A light-emitting apparatus may emit light having a color other than white. For example, if a light-emitting apparatus emits blue light, the first sealant and the second sealant may not include phosphors.

In the above embodiments, an LED chip mounted on the substrate is connected with another LED chip by a bonding wire using chip-to-chip bonding. However, an LED chip may be connected, by a bonding wire, with a line (metal film) provided on the substrate, and electrically connected with another LED chip via the line.

In the above embodiment, an LED chip is described as an example of a light-emitting element used for the light-emitting apparatus. However, solid light-emitting elements of other types including a semiconductor light-emitting element such as a semiconductor laser and an electroluminescent (EL) element such as an organic EL element or an inorganic EL element may be employed as the light-emitting element.

A stack structure illustrated in the cross-sectional views in the embodiments above is an example, and the present disclosure is not limited to such a stack structure. Specifically, similarly to the above stack structure, a stack structure which achieves distinctive functions of the present disclosure is also included in the present disclosure. For example, another layer may be provided between layers of the stack structure, in a range which can achieve an equivalent function to the function of the above stack structure.

The above embodiment shows examples of main materials which constitute layers of the stack structure, yet the layers of the stack structure may include other materials within a range which can achieve an equivalent function to the function of the above stack structure.

The scope of the present disclosure may also include embodiments as a result of adding various modifications to the embodiments that may be conceived by those skilled in the art, and embodiments obtained by combining elements and functions in the embodiments in any manner as long as the combination does not depart from the spirit of the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claim is:

1. A light-emitting apparatus, comprising:
   a substrate including a first region and a second region aligned in a first direction;
   a first light-emitting element group and a second light-emitting element group disposed on the first region on the substrate;
   a third light-emitting element group and a fourth light-emitting element group disposed on the second region on the substrate;
   a first terminal, a second terminal, a third terminal, and a fourth terminal disposed on the substrate; and
   a first relay line and a second relay line disposed in a region between the first region and the second region on the substrate, and extending at least partially parallel to each other in a second direction that crosses the first direction, wherein
   the first light-emitting element group is electrically connected with the first terminal and the first relay line,
   the second light-emitting element group is electrically connected with the second terminal and the second relay line,
   the third light-emitting element group is electrically connected with the third terminal and the first relay line, and
   the fourth light-emitting element group is electrically connected with the fourth terminal and the second relay line.

2. The light-emitting apparatus according to claim 1, wherein
   the first light-emitting element group comprises a plurality of first light-emitting element groups,
   the second light-emitting element group comprises a plurality of second light-emitting element groups,
   the third light-emitting element group comprises a plurality of third light-emitting element groups, and
   the fourth light-emitting element group comprises a plurality of fourth light-emitting element groups.

3. The light-emitting apparatus according to claim 1, wherein
   the first relay line is closer to the second region than the second relay line is,
   the first light-emitting element group is electrically connected with the first relay line via a first metal line extending across the second relay line, and
   the fourth light-emitting element group is electrically connected with the second relay line via a second metal line extending across the first relay line.

4. The light-emitting apparatus according to claim 1, wherein
   in the first region, the first light-emitting element group and the second light-emitting element group are disposed adjacently along the second direction, the second direction crossing the first direction in which the first region and the second region are aligned,
   in the second region, the third light-emitting element group and the fourth light-emitting element group are disposed adjacently along the second direction, and
   a direction in which the first light-emitting element group and the third light-emitting element group are aligned crosses a direction in which the second light-emitting element group and the fourth light-emitting element group are aligned.

5. The light-emitting apparatus according to claim 4, wherein
   the first light-emitting element group and the fourth light-emitting element group are disposed adjacently in the first direction, and
   the second light-emitting element group and the third light-emitting element group are disposed adjacently in the first direction.

6. The light-emitting apparatus according to claim 5, further comprising:
   first partitions located between the first light-emitting element group and the second light-emitting element group, and between the third light-emitting element group and the fourth light-emitting element group, in a plan view; and
   second partitions located between the first light-emitting element group and the fourth light-emitting element group, and between the second light-emitting element group and the third light-emitting element group, in the plan view.

7. The light-emitting apparatus according to claim 6, wherein
in the plan view, the second partitions overlap a region between the first relay line and the second relay line.

8. The light-emitting apparatus according to claim 1, further comprising:
a first sealant above the first light-emitting element group and the third light-emitting element group; and
a second sealant above the second light-emitting element group and the fourth light-emitting element group.

9. The light-emitting apparatus according to claim 8, wherein
the first sealant and the second sealant each include phosphors of different colors and silica fillers configured to prevent settling of the phosphors.

10. The light-emitting apparatus according to claim 8, wherein
phosphor content of the first sealant is different from phosphor content of the second sealant, such that a color temperature of light emitted through the first sealant is different from a color temperature of light emitted through the second sealant.

11. The light-emitting apparatus according to claim 8, further comprising:
a third sealant which collectively seals the first light-emitting element group, the second light-emitting element group, the third light-emitting element group, and the fourth light-emitting element group.

12. The light-emitting apparatus according to claim 11, wherein
the first sealant and the second sealant are over the third sealant.

13. The light-emitting apparatus according to claim 11, wherein
the first sealant and the second sealant are under the third sealant.

14. The light-emitting apparatus according to claim 1, wherein the light-emitting apparatus is configured to emit light having a first color when a voltage is applied between the first terminal and the third terminal, and to emit light having a second color when a voltage is applied between the second terminal and the fourth terminal.

15. The light-emitting apparatus according to claim 1, wherein
the substrate has a quadrilateral shape in a plan view, and
the first terminal, the second terminal, the third terminal, and the fourth terminal are disposed one at each of corners of the substrate.

16. The light-emitting apparatus according to claim 1, further comprising:
a first line which is disposed on the substrate, and electrically connects the first light-emitting element group and the first terminal;
a second line which is disposed on the substrate, and electrically connects the second light-emitting element group and the second terminal;
a third line which is disposed on the substrate, and electrically connects the third light-emitting element group and the third terminal; and
a fourth line which is disposed on the substrate, and electrically connects the fourth light-emitting element group and the fourth terminal.

17. The light-emitting apparatus according to claim 16, further comprising:
an annular wall externally surrounding the first light-emitting element group, the second light-emitting element group, the third light-emitting element group, and the fourth light-emitting element group, wherein
each of the first line, the second line, the third line, and the fourth line is at least partially disposed under the annular wall on the substrate.

18. The light-emitting apparatus according to claim 1, wherein
a voltage having a same value is applied to the first terminal and the second terminal.

19. The light-emitting apparatus according to claim 1, wherein
a voltage having a same value is applied to the third terminal and the fourth terminal.

20. An illumination apparatus, comprising:
the light-emitting apparatus according to claim 1; and
a lighting apparatus which supplies the light-emitting apparatus with power for the light-emitting apparatus to emit light.

* * * * *